(12) United States Patent
Fujishima

(10) Patent No.: US 6,639,274 B2
(45) Date of Patent: Oct. 28, 2003

(54) SEMICONDUCTOR DEVICE

(75) Inventor: Naoto Fujishima, Nagano (JP)

(73) Assignee: Fuji Electric Co., Ltd., Kawasaki (JP)

( * ) Notice: Subject to any disclaimer, the term of this patent is extended or adjusted under 35 U.S.C. 154(b) by 0 days.

(21) Appl. No.: 10/156,641

(22) Filed: May 29, 2002

(65) Prior Publication Data

US 2002/0179967 A1 Dec. 5, 2002

(30) Foreign Application Priority Data

May 30, 2001  (JP) ........................................ 2001-162383

(51) Int. Cl.[7] ............................................. H01L 31/119
(52) U.S. Cl. ....................... 257/330; 257/341; 257/343; 257/E29.039
(58) Field of Search ........................ 257/330, E29.031, 257/E29.039, E29.112, E29.187, 341, 343

(56) References Cited

U.S. PATENT DOCUMENTS 5,828,100 A  * 10/1998  Tamba et al. ................ 257/328
6,316,807 B1 * 11/2001  Fujishima et al. .......... 257/333

FOREIGN PATENT DOCUMENTS

JP          2000-114512          4/2000

OTHER PUBLICATIONS

Fujishima, Naoto and Salama, C. Andre T., "A Trench Lateral Power MOSFET Using Self–Aligned Trench Bottom Contact Holes", *Department of Electrical and Computer Engineering, University of Toronto, Toronto, Ontario, Canada M5S 3G4*, 4 Pages, IEEE, 1997.

Parthasarathy, V., et al., "A 0.35μm CMOS Based Smart Power Technology For 7V–50V Applications", *SmartMOS Technology Center, Semiconductor Products Sector, Motorola Inc.*, 4 Pages, IEEE, 2000, Catalog No. 00CH37094C.

U.S. patent application Ser. No. 10/156,757, Fujishima, filed May 29, 2002.

* cited by examiner

*Primary Examiner*—Jasmine Clark

(57) ABSTRACT

A trench lateral MOSFET including a gate region where gate polysilicon is lead out to a substrate surface, and an active region where electric current is driven in a MOSFET operation, and with a trench width, in the gate region Wg, being narrower than a trench width in the active region Wt such that neither source polysilicon nor drain polysilicon is formed in a gate region within the trench. A planar layout of the MOSFET of the invention is a mesh pattern. The mesh pattern includes a trench-etched region in a mesh shape and a non-trench-etched region in an island or ribbed shape left in the trench-etched region. Alternatively, the mesh pattern includes a non-trench-etched region in a mesh shape and a trench-etched region in an island or ribbed shape formed in the non-trench-etched region.

20 Claims, 30 Drawing Sheets

SEMICONDUCTOR DEVICE

CROSS-REFERENCE TO RELATED APPLICATIONS

This application claims the benefit of Japanese Patent Application No. 2001-162383, filed on May 30, 2001, the disclosure of which is incorporated herein by reference.

1. Field of the Invention

The present invention relates to a semiconductor device, in particular, to a low on-resistance power MOSFET or an insulated gate field effect transistor that is used in an IC exhibiting high breakdown voltage and controlling high current, for example, an IC in a switching regulator, an IC for driving an automobile electric power system, or an IC for driving a flat panel display. The present invention also relates to a method for manufacturing such a semiconductor device.

2. Description of the Related Art

The importance of power ICs containing a power MOSFET has been increasing with the rapid spread of portable apparatuses and advancements of communications technology in recent years. A power IC integrating a lateral power MOSFET with a control circuit is expected to achieve miniaturization, low power consumption, high reliability, and low cost in comparison with a conventional construction combining a discrete power MOSFET with a controlling and driving circuit. Consequently, developmental work is actively being conducted for high performance lateral power MOSFETs based on CMOS processes.

The inventor of the present invention disclosed a lateral power MOSFET having a trench structure (hereinafter referred to as a trench lateral power MOSFET) in the paper entitled "A trench lateral power MOSFET using self-aligned trench bottom contact holes" in IEDM '97 Digest, p. 359–362, 1997. FIGS. 29 through 31 show a schematic structure of this trench lateral power MOSFET. FIG. 29 is a plan view. FIG. 30 is a cross sectional view along line A–A' of FIG. 29 and shows a structure of a region for driving current as a MOSFET operation, the region being referred to as "an active region". FIG. 31 is a cross sectional view along line B–B' of FIG. 29 and shows a structure of a region for leading a gate polysilicon out to a substrate surface, the region being referred to as "a gate region".

The trench lateral power MOSFET 1 includes a p-type substrate 10 provided with a trench 11, a gate oxide film 12 formed on a side wall region of the trench 11, gate polysilicon 13 formed inside the gate oxide film 12, and drain polysilicon 20 formed inside the gate polysilicon 13 through interlayer dielectric 16 and 30. A drain region 19 that is an n-type diffusion region is formed in a bottom region of the trench 11. A source region 17 that is an n-type diffusion region is formed in a outer peripheral region of the trench 11. The drain region 19 is surrounded by a drain drift region 18, which is an n-type diffusion region, surrounding the lower part of the trench 11. The drain drift region 18 is surrounded by a p body region 21 that is a p-type diffusion region.

A p-type diffusion region 22 is formed outside the source region 17. A p base region 23 is formed under the source region 17. A thick oxide film 24 is formed inside the lower part of the trench 11 to secure a withstand voltage. Reference numeral 14, in FIGS. 29 through 31, represents a source electrode, reference numeral 15 a drain electrode, reference numeral 25 a gate electrode, reference numerals 26 and 27 contact parts, reference numeral 28 an n-type diffusion region, and reference numeral 29 represents an interlayer oxide film.

Generally, a MOSFET is desired to have a low on-resistance per unit area. An important parameter to determine the on-resistance per unit area is a channel width per unit area. Let P to be the channel width per unit area, Wch the channel width, and A the area of the device, then P is given by Wch/A. A large P value is favorable to integrate transistors with a high density and to raise current driving ability per unit area. The P value of a conventional lateral power MOSFET without a trench structure is $0.22 \times 10^6$ [m$^{-1}$] under the 0.6 $\mu$m rule and at breakdown voltage of 30 V class, and $0.28 \times 10^6$ [m$^{-1}$] under the 0.35 $\mu$m rule and at breakdown voltage of 30 V class. When the trench structure as shown in FIGS. 29 through 31 is applied, P value increases to $0.4 \times 10^6$ [m$^{-1}$] under the 0.6 $\mu$m rule and at breakdown voltage of 30 V class, and $0.67 \times 10^6$ [m$^{-1}$] under the 0.35 $\mu$m rule and at breakdown voltage of 30 V class by integration with higher density.

However, in the conventional trench lateral power MOSFET, over-etching during the process of making a contact hole through the interlayer dielectric at the trench bottom may cause the interlayer dielectric between the gate polysilicon and the drain polysilicon to become thinner or to disappear in the trench bottom portion of the gate region. This raises a problem of lowered breakdown voltage or short-circuit failure between the gate electrode and the drain electrode. This problem will also arise if source polysilicon is placed in the trench instead of the drain polysilicon.

In addition, the conventional trench lateral power MOSFET has trenches that are arranged in a stripe pattern. Consequently, dense integration of the channel width was not enough and possibility of lower on-resistance was left to be attained.

Parasitic capacity that affects switching characteristics of a MOSFET is chiefly formed between a gate electrode and a substrate with an intervening gate oxide film. There are three kinds of parasitic capacity: parasitic capacity between a gate and a drain Cgd, parasitic capacity between a gate and a body Cgb, and parasitic capacity between a gate and a source Cgs. To obtain favorable switching characteristics, these types of parasitic capacity should be decreased. However, because the conventional stripe pattern was formed in nearly the same proportion, the parasitic capacity was not improved. Thus, a large overlap capacity between a gate electrode and an extended drain inhibited high operating speed and low losses.

SUMMARY OF THE INVENTION

The present invention has been made in view of the above problems, and an object of the invention is to provide a trench lateral MOSFET that exhibits excellent insulation between electrodes, low on-resistance, and high speed switching characteristics.

Additional objects and advantages of the invention will be set forth in part in the description which follows and, in part, will be obvious from the description, or may be learned by practice of the invention.

To achieve the above object, a trench lateral MOSFET according to aspects of the present invention includes a gate region in which gate polysilicon is lead out to a substrate surface and an active region in which electric current is driven in a MOSFET operation, and a trench width in the gate region Wg is narrower than a trench width in the active region Wt, such that a source polysilicon is not formed in the trench of the gate region when a source is formed at the trench bottom of the active region and a drain polysilicon is not formed in the trench of the gate region when a drain region is formed at the trench bottom of the active region.

According to this feature of the present invention, neither source polysilicon nor drain polysilicon exists in the trench of the gate region.

A trench lateral power MOSFET according to aspects of the present invention has a planar layout of a mesh pattern. The mesh pattern includes a trench-etched region in a mesh shape and a non-trench-etched region in an island or ribbed shape left un-etched in the trench-etched region. Alternatively, the mesh pattern may include a non-trench-etched region left un-etched in a mesh shape and a trench-etched region formed in an island or ribbed shape in the non-trench-etched region. A trench width of a portion without providing a contact is thereby made smaller.

According to this feature of the invention, channel width or extended drain width per unit area of a MOSFET increases because the trench-etched region or non-trench-etched region is in an island or ribbed shape. By decreasing the trench width of the portion lacking a contact, the channel width or extended drain width per unit area further increases. In a trench lateral power MOSFET having a sectional structure in which a trench is formed by trench-etching twice, with a space in the trench being filled with source polysilicon, parasitic capacity between the gate and the drain is suppressed by making the trench-etched region to be in a mesh shape and the trench width of the portion without contact to be smaller. In a trench lateral power MOSFET having a sectional structure in which a trench formed by trench-etching once, with a space in the trench being filled with drain polysilicon, overlap capacity of opposing gate polysilicon and drain polysilicon is suppressed with respect to the channel width by making the trench-etched region to be in a mesh shape.

BRIEF DESCRIPTION OF THE DRAWINGS

These and other objects and advantages of the present invention will become apparent and more readily appreciated from the following description of the embodiments, taken in conjunction with the accompanying drawings of which.

DETAILED DESCRIPTION OF THE PREFERRED EMBODIMENTS

Aspects of some preferred embodiments of the present invention will be described in detail in the following with reference to accompanying drawings. In the following description, a first conductor is gate polysilicon and a second conductor is source polysilicon or drain polysilicon. Dimensions in the accompanying drawings are not always in correct scale.

Figure 1:
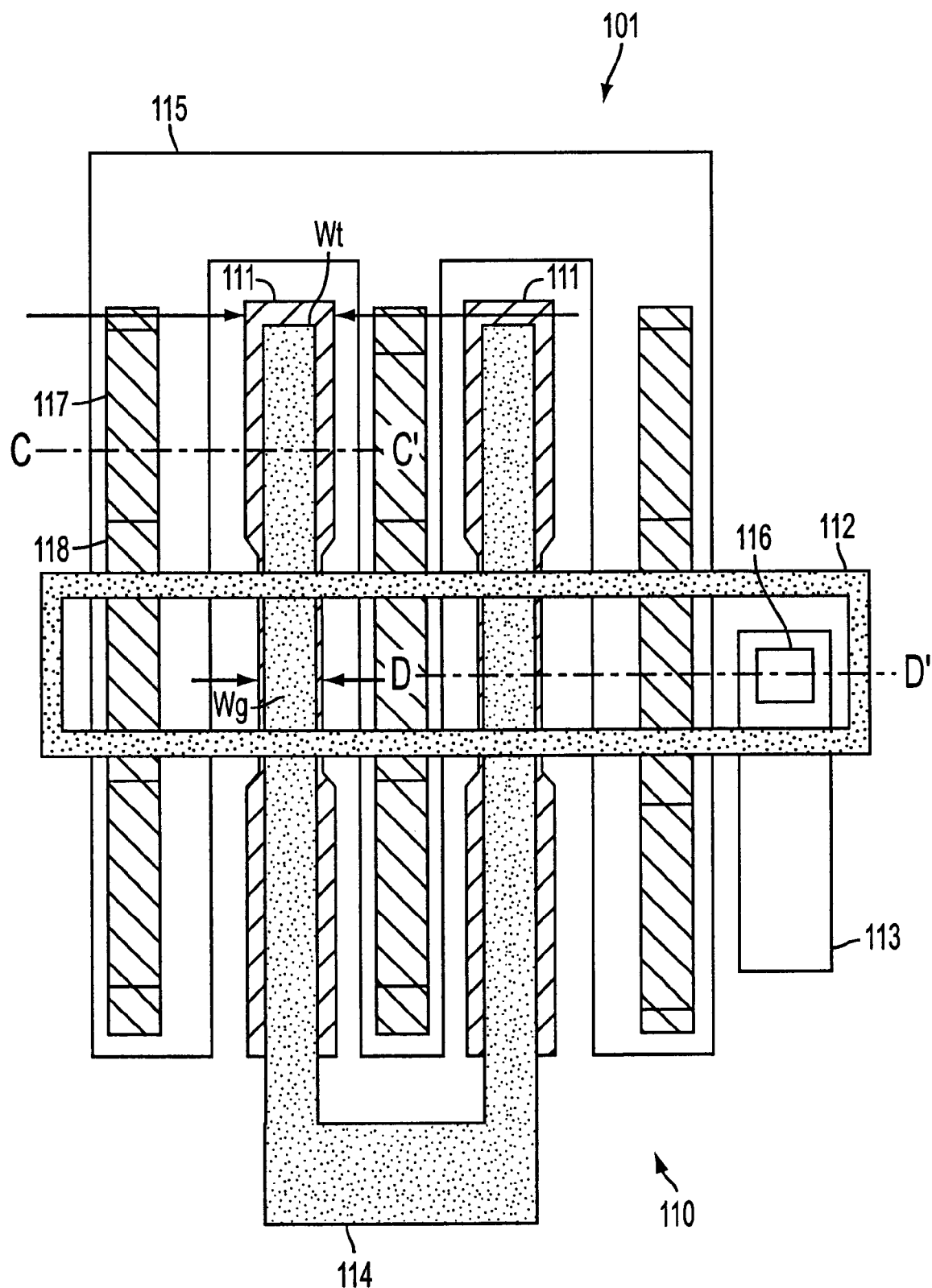
FIG. 1 is a plan view schematically showing a structure of a trench lateral power MOSFET according to a first embodiment of the present invention.

FIG. 1 is a plan view showing schematically a structure of a trench lateral power MOSFET according to a first embodiment of the present invention. This trench lateral power MOSFET 101 includes a p-type substrate 110, a plurality of trenches 111 in a stripe shape formed in the substrate, a gate polysilicon 112 crossing the trenches 111, a gate electrode 113 formed on the substrate surface, a source electrode 114 in a comb shape, and a drain electrode 115 in a comb shape.

The gate polysilicon 112 electrically connects to the gate electrode 113 through a contact part 116. The source electrode 114 is formed almost over the trench 111 and electrically connects to a source polysilicon in the trench 111 through a contact part (omitted in FIG. 1). The source polysilicon electrically connects to a source region, which is an n-type diffusion region, at the trench bottom. The drain electrode 115 electrically connects to a drain region 118, which is an n-type diffusion region, through a contact part 117.

With Wt being a trench width in the active region in which electric current is driven in a MOSFET operation, and with Wg being a trench width in the gate region in which gate polysilicon is lead out to a substrate surface, Wg is smaller than Wt. That is, the width of the trench 111 is not uniform, but narrower in the gate region than in the active region. A trench lateral power MOSFET having such a construction will be explained regarding cross sectional constructions in the active region and in the gate region in the following, with reference to specific examples. In the first and second examples below, the cross sectional structure in the active region is an example of sectional structures along line C–C' of FIG. 1, and the cross sectional structure in the gate region is an example of sectional structures along line D–D' of FIG. 1.

Figure 2:
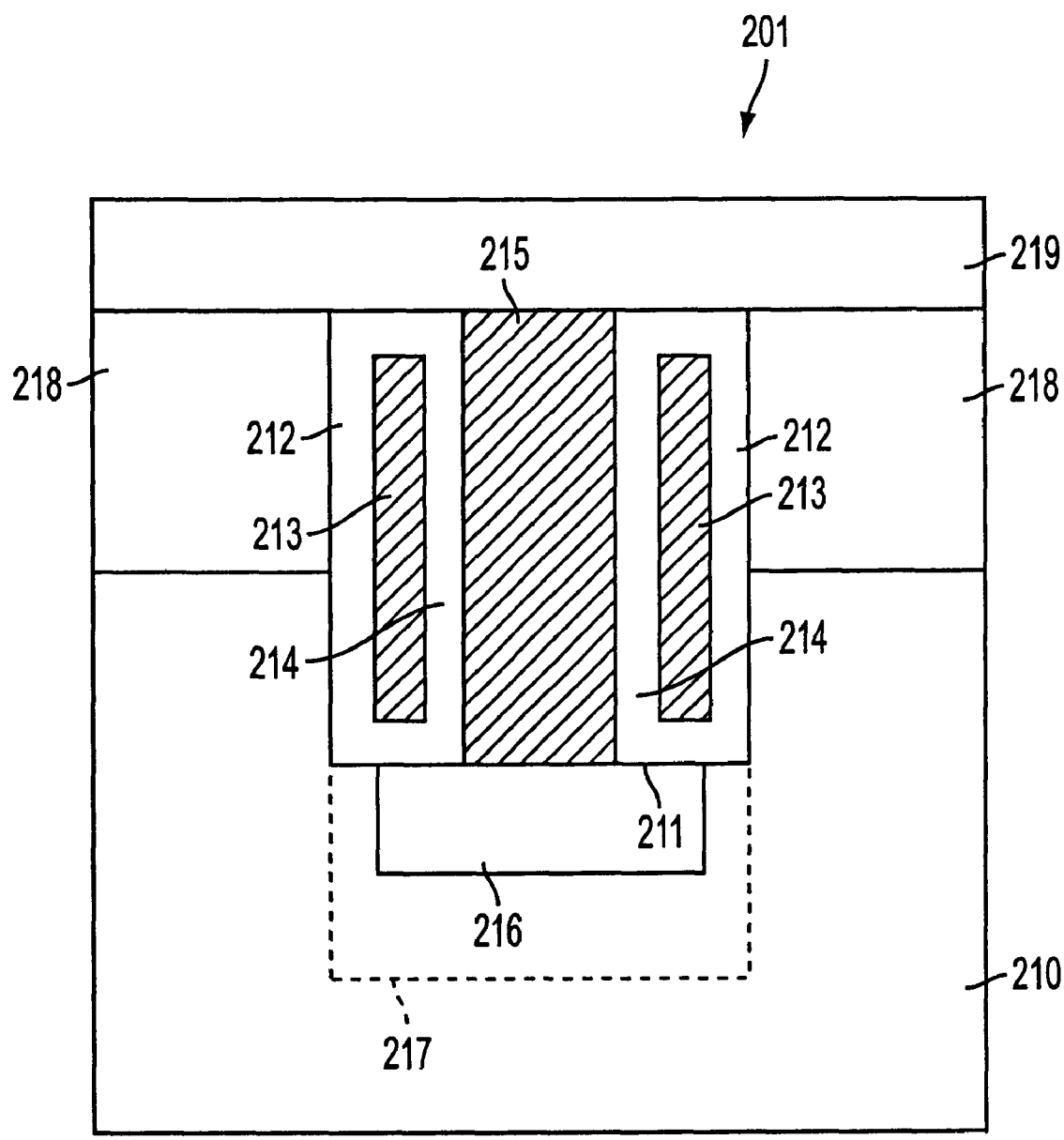
FIG. 2 is a cross-sectional view schematically showing the sectional structure along line C–C' of FIG. 1, of a first example of the trench lateral power MOSFET according to the first embodiment of the present invention.

FIG. 2 is a cross-sectional view showing schematically a sectional structure of the active region in the first example. In the active region of a trench lateral power MOSFET 201 of the first example, a gate oxide film 212 that is a gate insulating film is formed on an inner surface of a trench 211 formed in a p-type substrate 210, gate polysilicon 213 is formed inside the gate oxide film 212, interlayer dielectric 214, which is a second interlayer dielectric, is formed inside the gate polysilicon 213, and source polysilicon 215 fills the space inside the interlayer dielectric 214. The source polysilicon 215 is provided running vertically in the trench 211. Examples of thickness of films are: gate oxide film 212, 0.05 μm, gate polysilicon 213, 0.3 μm, and second interlayer dielectric 214, 0.3 μm. An optimum width of the source polysilicon 215 (contact width) would be 1 μm, for example.

At the bottom of the trench 211, a first n-type diffusion region 216 is formed that electrically connects to the source polysilicon 215. A p base region 217 is formed surrounding the first n-type diffusion region 216. On the surface region of the substrate outside the trench 211, a second n-type diffusion region 218 is formed. Upper surface of the substrate is coated with interlayer dielectric 219. Through contact holes (not shown in FIG. 2), which are opened to this interlayer dielectric 219, the source polysilicon 215, the gate polysilicon 213, and the second n-type diffusion region 218 electrically connect to a source electrode, a gate electrode, and a drain electrode, respectively, although the electrodes are omitted from the figure.

In this first example, the trench width Wt in the active region is in the range from 1.3 to 4.0 μm. If Wt is less than 1.3 μm, the source polysilicon 215 cannot be deposited in the trench 211. That means the first n-type diffusion region 216 formed at the bottom of the trench 211 does not electrically connect to the source electrode. As a result, a normal operating function of acting as an active region for driving and controlling electric current does not work, if Wt is less than 1.3 μm.

Figure 3:
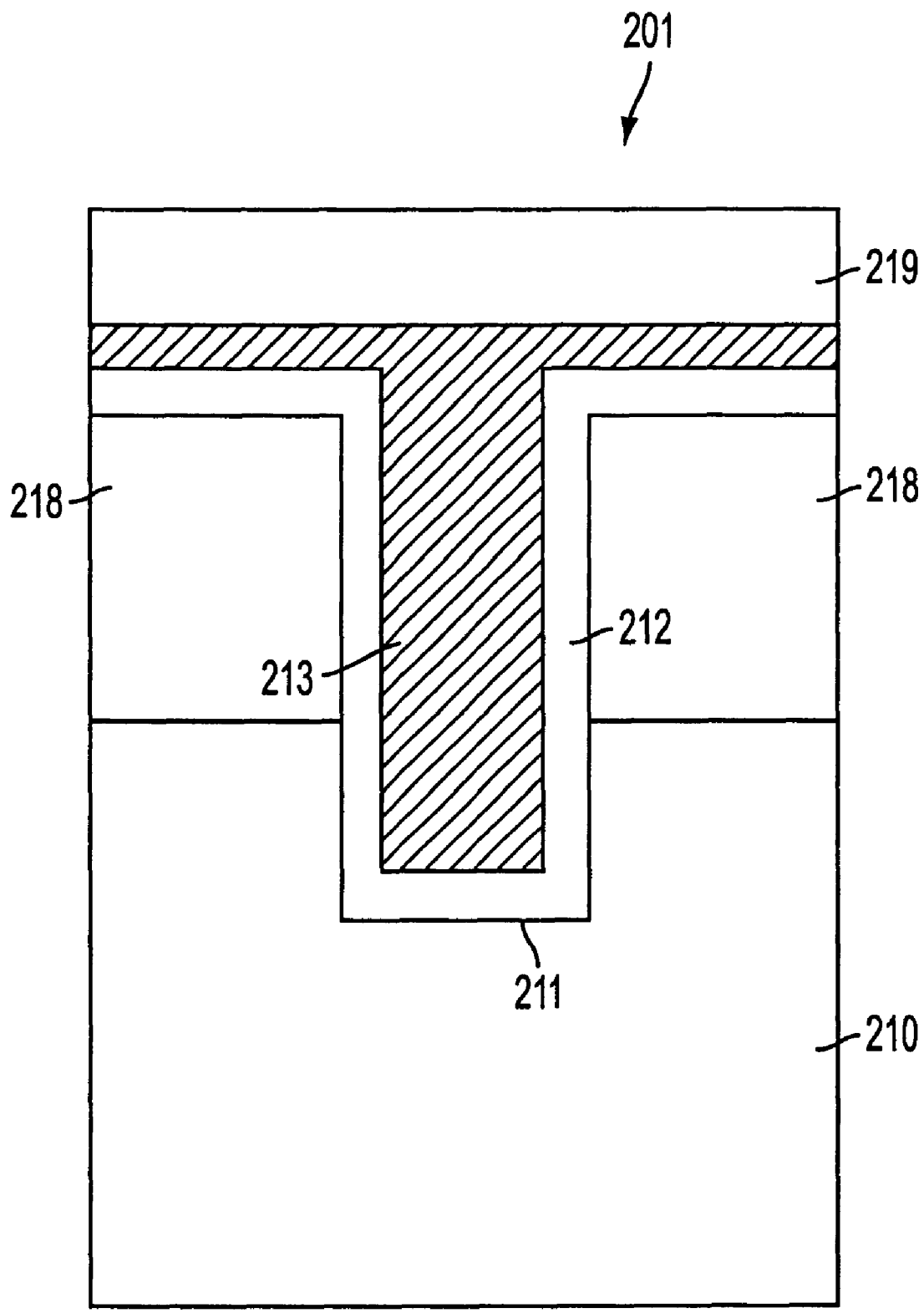
FIG. 3 is a cross-sectional view schematically showing the sectional structure along line D–D' of FIG. 1, of the first example of the trench lateral power MOSFET according to the first embodiment of the present invention.
Figure 4:
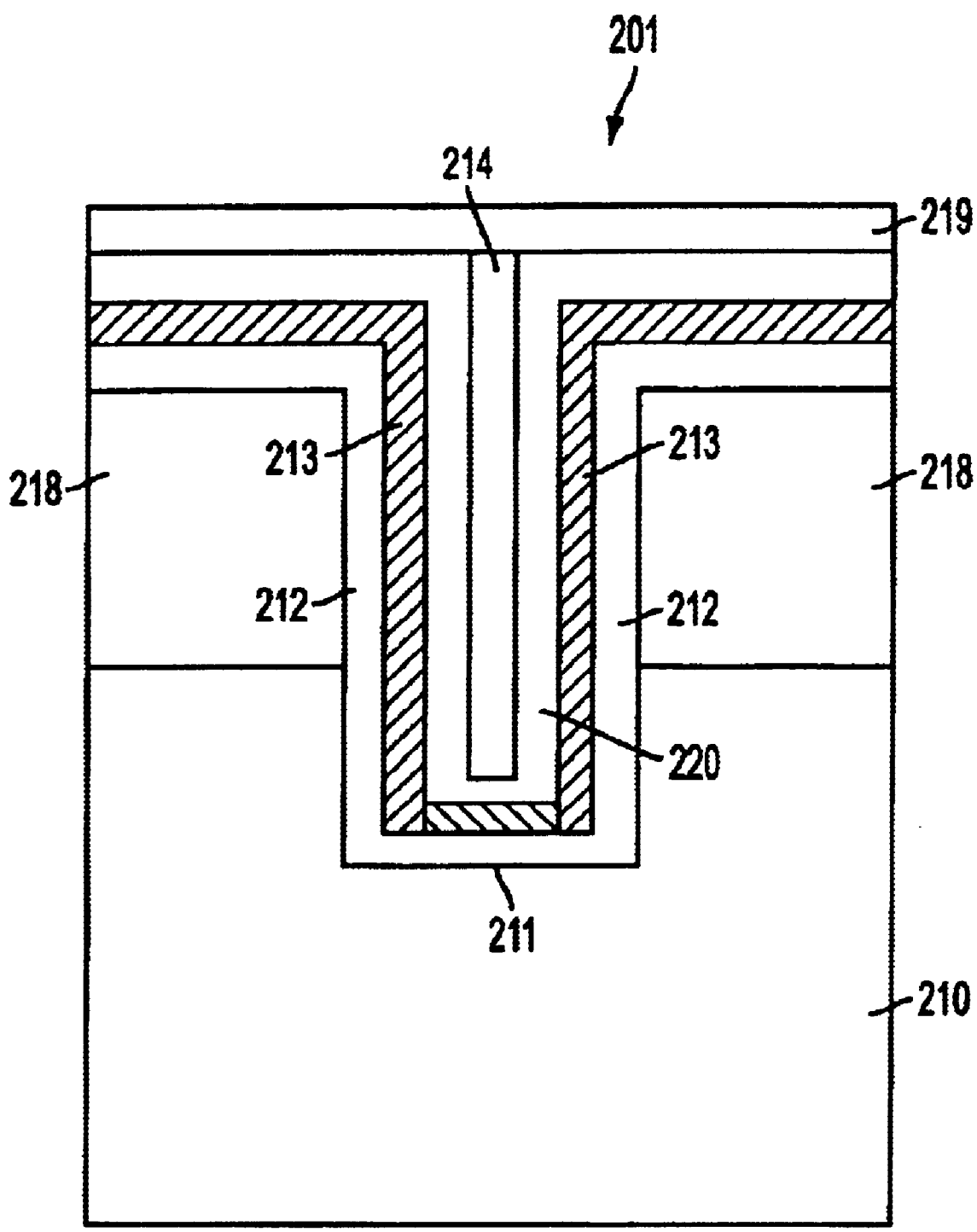
FIG. 4 is a cross-sectional view schematically showing another sectional structure along line D–D' of FIG. 1, of the first example of the trench lateral power MOSFET according to the first embodiment of the present invention.

The structure of the gate region in the first example is shown in FIG. 3 or FIG. 4, depending on the trench width in the gate region Wg. In the case Wg is in the range from 0.2 μm to 0.7 μm, the structure of the gate region is the shown in FIG. 3. A gate oxide film 212 is formed on the inside wall of the trench 211, which is formed in the p-type substrate 210. Gate polysilicon 213 fills the space inside the gate oxide film 212. In the case Wg is in the range from 0.7 μm to 1.3 μm, the structure of the gate region is shown in FIG. 4. A gate oxide film 212 is formed on the inside wall of the trench 211. Gate polysilicon 213 is formed inside the gate oxide film 212. First interlayer dielectric 220 is formed inside the gate polysilicon 213, and the second interlayer dielectric 214 fills the space inside the first interlayer dielectric 220. The first interlayer dielectric 220 is a different article from the second interlayer dielectric 214. Thickness of the first interlayer dielectric 220 is 0.4 μm, for example.

In the structure of the gate region, as shown in FIG. 3 or FIG. 4, the trench 211 is filled with the gate oxide film 212, the gate polysilicon 213, and the interlayer dielectric 214 and 220, before a step of depositing source polysilicon. Consequently, after a step of depositing source polysilicon, the source polysilicon on the gate region is removed by a process of etchback. As a result, source polysilicon does not exist in the trench 211 of the gate region. Any gate-source short-circuit failure is, thus, avoided in the gate region.

Figure 5:
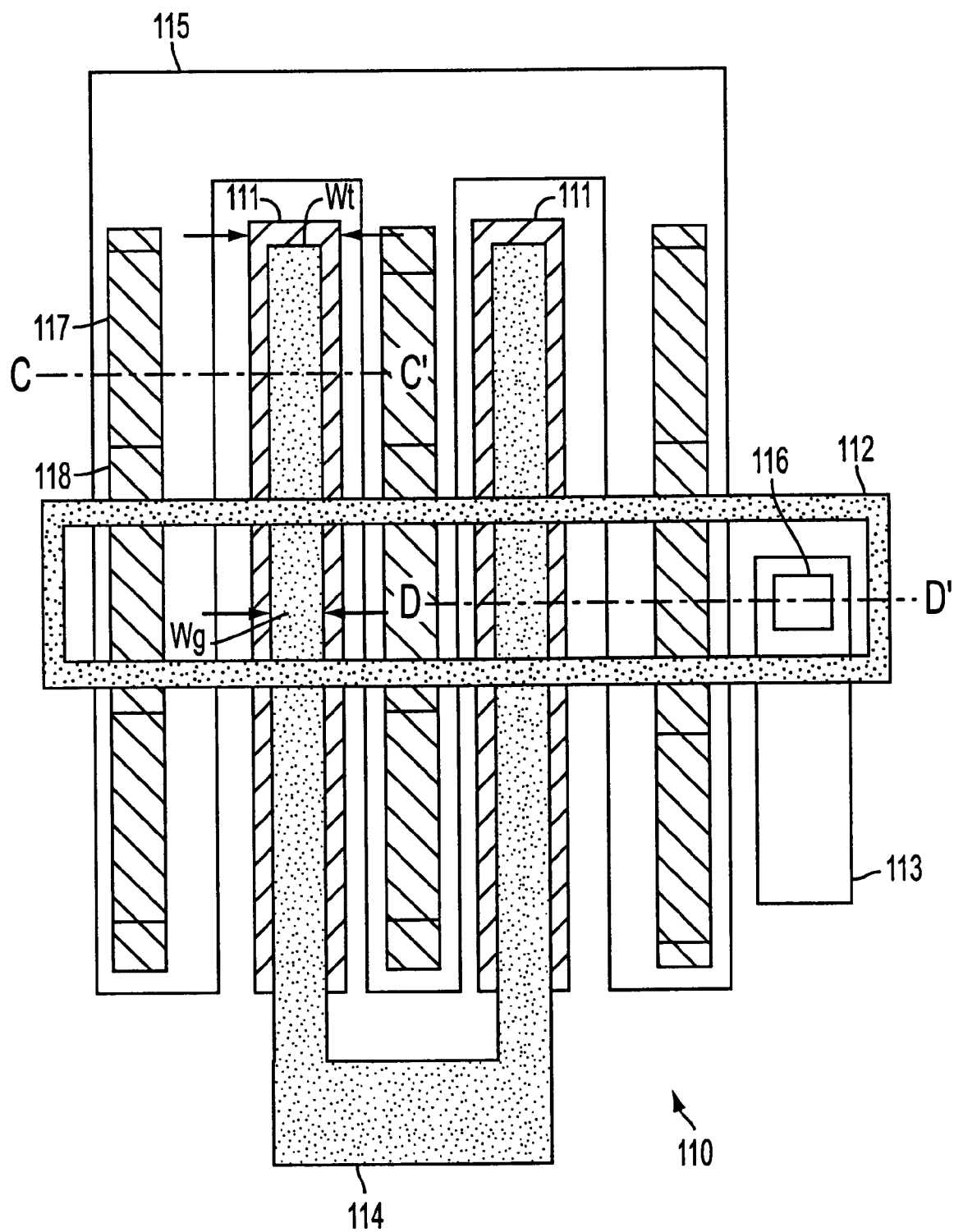
FIG. 5 is a plan view schematically showing a structure of a conventional trench lateral power MOSFET.

If Wg is larger than 1.3 μm in the gate region, source polysilicon is deposited in the space inside the second interlayer dielectric 214 in the trench 211. An inventor's study showed that gate-source short-circuit failure occurred at the rate of 70% with the devices in which both the trench width in the active region Wt and the trench width in the gate region Wg are equally 3 μm, that is, with the devices having a uniform trench width of 3 μm as the planar structure of FIG. 5. In contrast, the rate of gate-source short-circuit failure was not more than 2% with the devices in which the trench width in the active region Wt was 3 μm and the trench width in the gate region Wg was 1.3 μm or smaller like a planar structure shown in FIG. 1. In the trench lateral power MOSFET 201 shown in FIGS. 2 through 4, the trench 211 is formed by trench-etching once.

Figure 6:
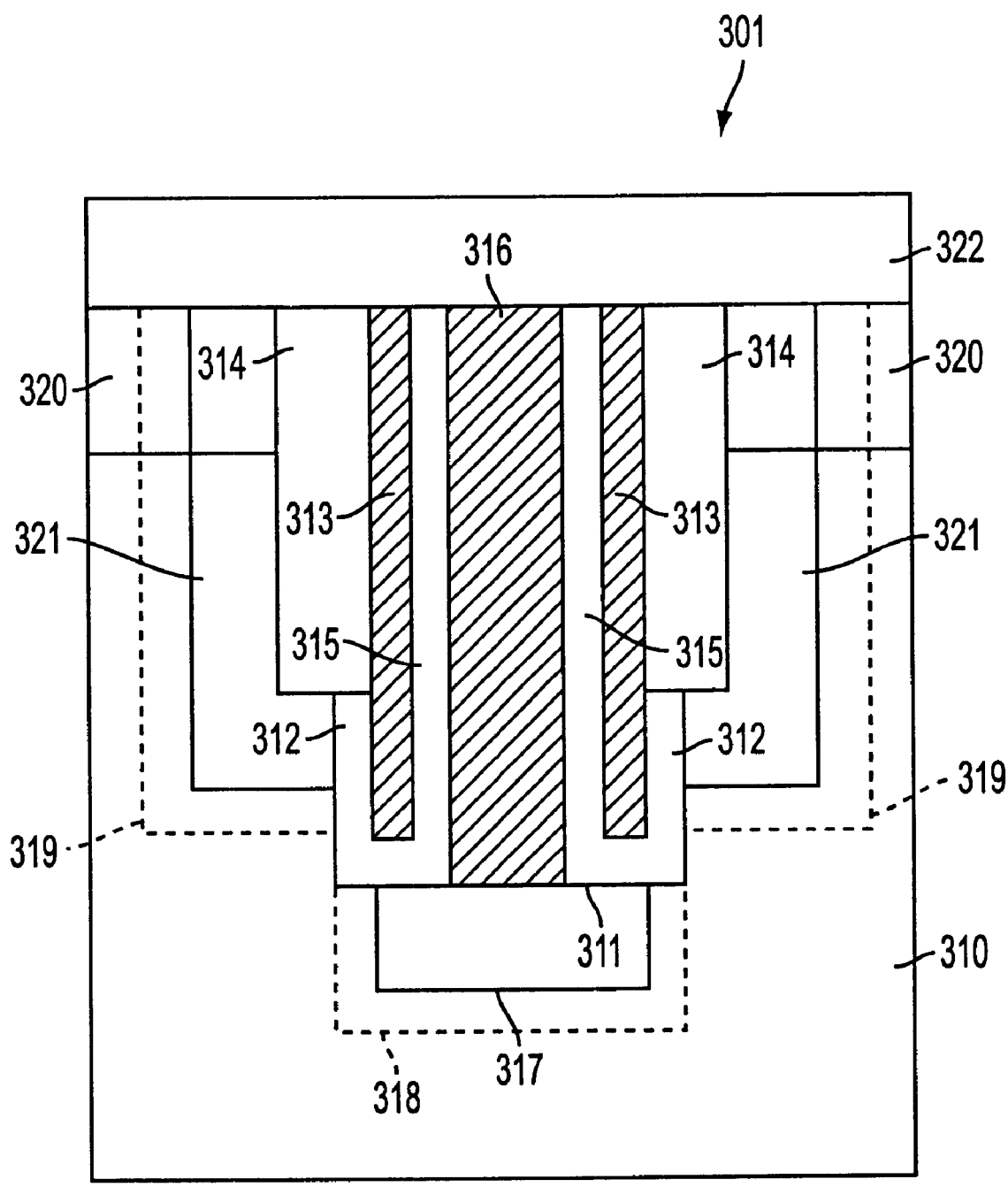
FIG. 6 is a cross-sectional view schematically showing the sectional structure along line C–C' of FIG. 1, of the second example of the trench lateral power MOSFET according to the first embodiment of the present invention.

FIG. 6 is a cross-sectional view schematically showing a sectional structure of an active region in the second example. In the active region of trench lateral power MOSFET 301 of the second example, a trench 311, formed in a p-type substrate 310, is filled with a gate oxide film 312, gate polysilicon 313, first interlayer dielectric 314, second interlayer dielectric 315, and source polysilicon 316. Numerical examples of thickness of the films are: gate oxide film 312, 0.05 μm, gate polysilicon 313, 0.6 μm, first interlayer dielectric 314, 0.6 μm, and second interlayer dielectric 315, 0.3 μm. An optimum contact width would be 1 μm, for example.

The reference numeral 317 in FIG. 6 represents first n-type diffusion region to which the source polysilicon 316 electrically connects. The symbol 318 represents a p base region, symbol 319 a p body region, symbol 320 second n-type diffusion region, symbol 321 an n drain region, and symbol 322 an interlayer dielectric. Here, the trench width in the active region Wt is in the range from 4.0 μm to 6.0 μm. If Wt is less than 4.0 μm, the source polysilicon 316 is not deposited in the trench 311. Then, the function of driving and controlling current as a normal performance of the active region cannot be obtained.

Figure 7:
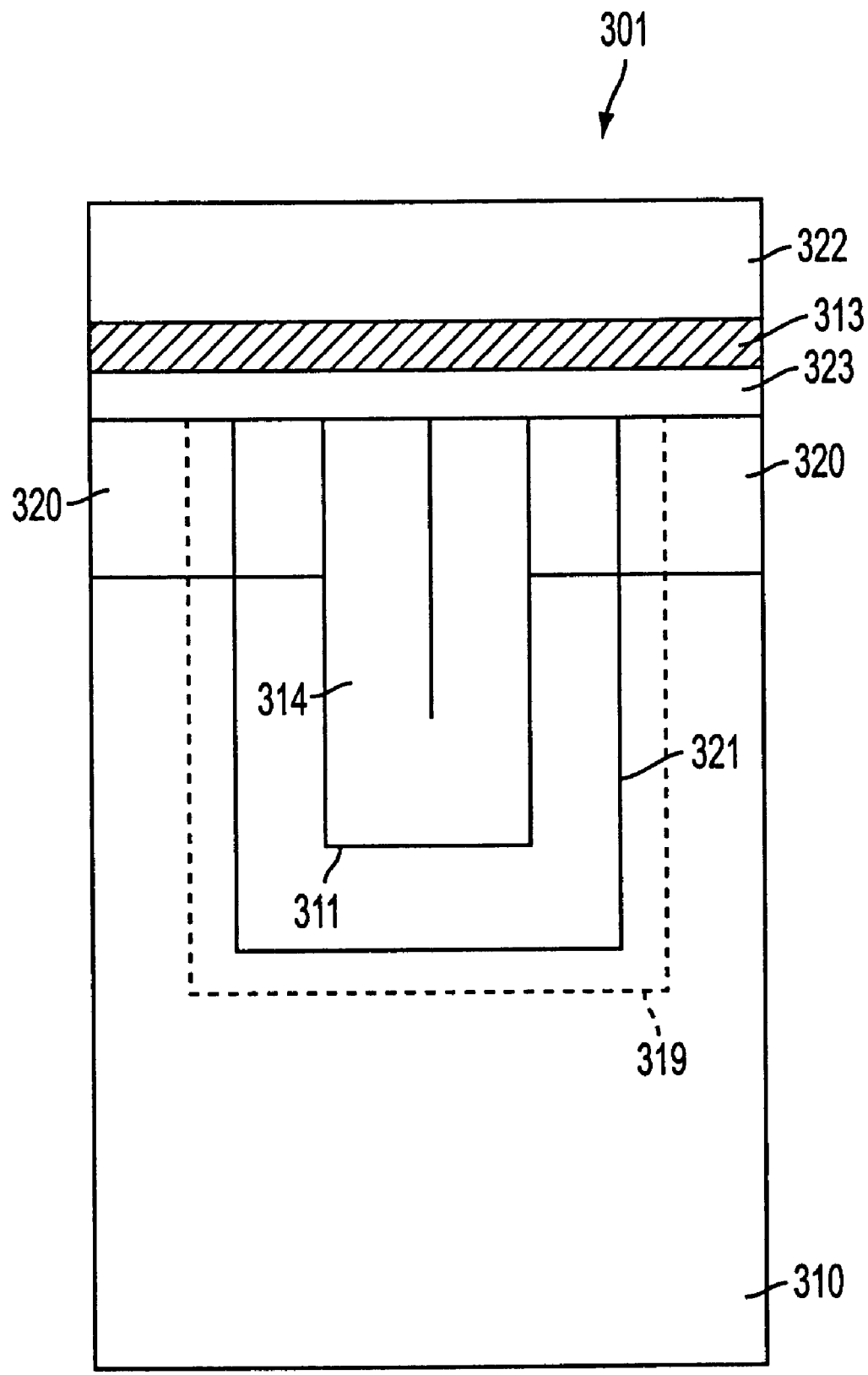
FIG. 7 is a cross-sectional view schematically showing the sectional structure along line D–D' of FIG. 1, of a second example of the trench lateral power MOSFET according to the first embodiment of the present invention.
Figure 8:
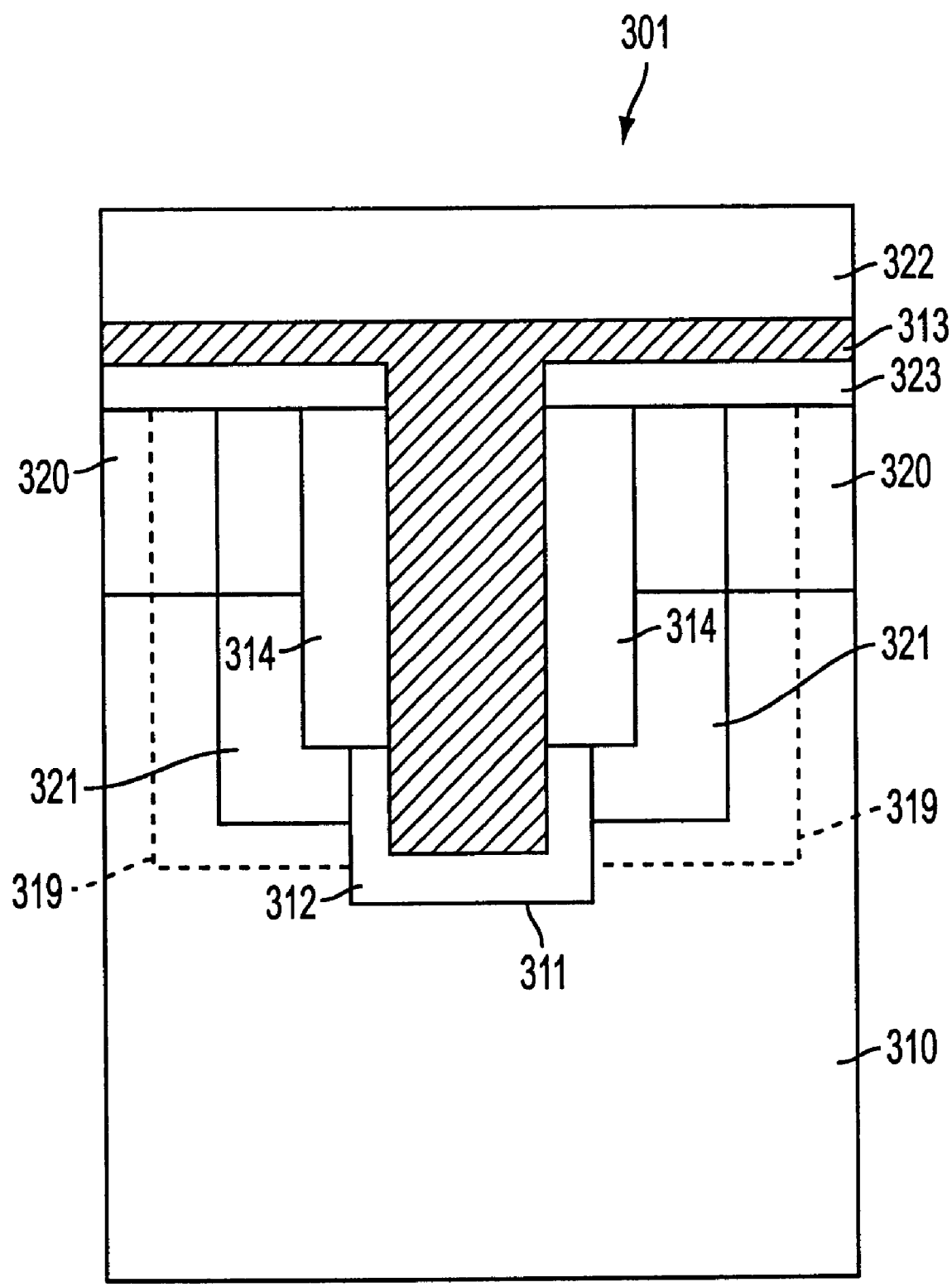
FIG. 8 is a cross-sectional view schematically showing another the sectional structure along line D–D' of FIG. 1, of the second example of the trench lateral power MOSFET according to the first embodiment of the present invention.
Figure 9:
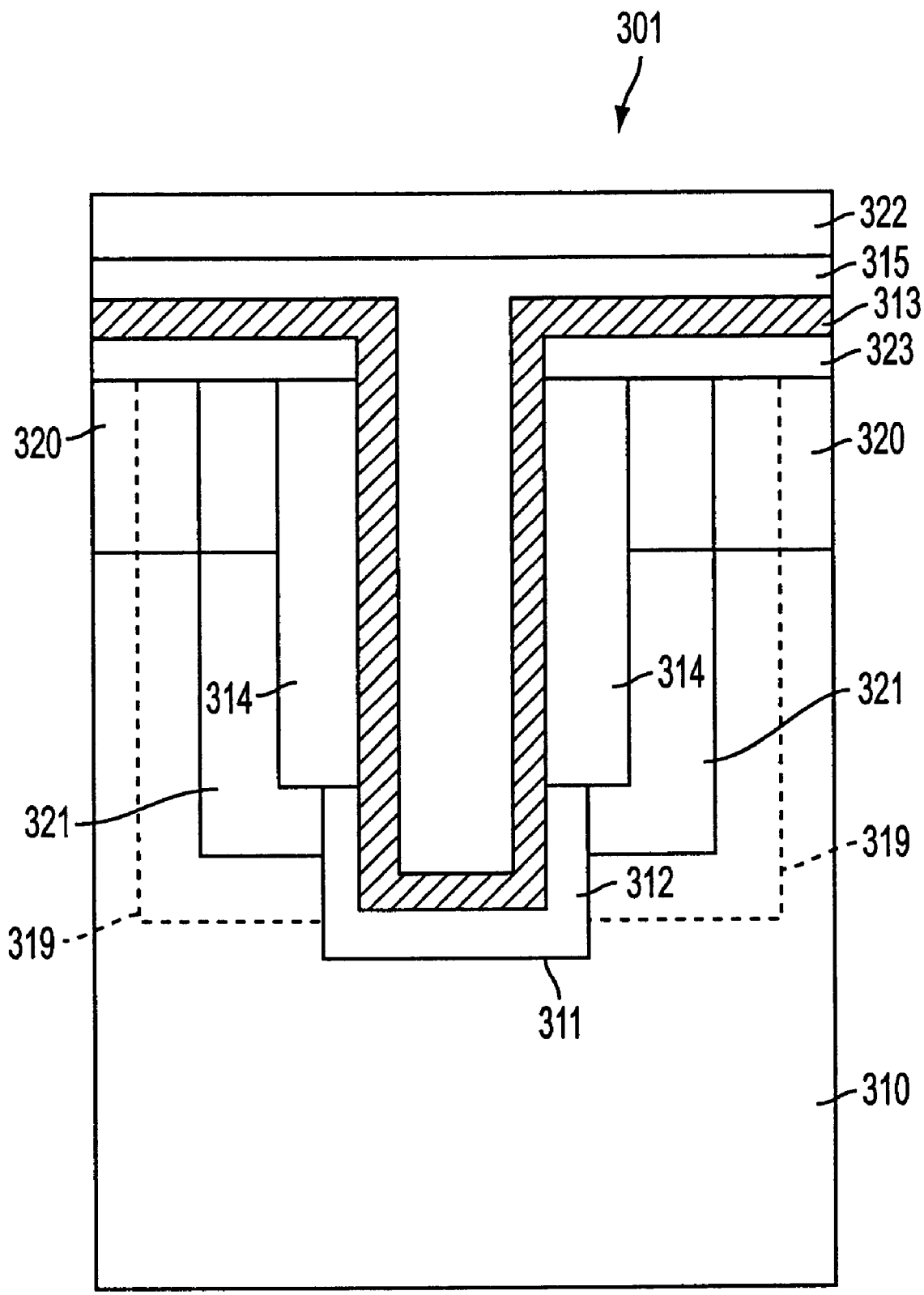
FIG. 9 is a cross-sectional view schematically showing still another sectional structure along line D–D' of FIG. 1, of the second example of the trench lateral power MOSFET according to the first embodiment of the present invention.

The structure of the gate region in the second example is as shown in FIG. 7, FIG. 8, or FIG. 9, depending on the trench width in the gate region Wg. In the case Wg is in the range from 0.5 μm to 1.2 μm, the structure of the gate region is shown in FIG. 7. The trench 311 is filled with the first interlayer dielectric 314. In the case Wg is in the range from 1.2 μm to 2.4 μm, the structure of the gate region is shown in FIG. 8. The trench 311 is filled with the gate oxide film 312, first interlayer dielectric 314, and gate polysilicon 313. In the case Wg is in the range from 2.4 μm to 4.0 μm, the structure of the gate region is shown in FIG. 9. The trench 311 is filled with the gate oxide film 312, first interlayer dielectric 314, gate polysilicon 313, and second interlayer dielectric 315. The reference numeral 323 in FIGS. 7 through 9 represents interlayer dielectric.

In the structure of the gate region as shown in any one of FIGS. 7 through 9, the trench 311 is filled with the gate oxide film 312, the gate polysilicon 313, second interlayer dielectric 315, and first interlayer dielectric 314, before a step of depositing source polysilicon. Consequently, after a step of depositing source polysilicon, the source polysilicon on the gate region is removed by a process of etchback. Thus, any gate-source short-circuit failure is avoided in the gate region.

If Wg is larger than 4.0 μm, source polysilicon is deposited in the space inside the second interlayer dielectric 315 in the trench 311. An inventor's study showed that gate-source short-circuit failure occurred at the rate of 80% with the devices in which both the trench width in the active region Wt and the trench width in the gate region Wg are equally 5 μm. In contrast, the rate of gate-source short-circuit failure was not more than 2% with the devices in which the trench width in the active region Wt was 5 μm and the trench width in the gate region Wg was 2.4 μm or smaller. In the trench lateral power MOSFET 301 shown in FIGS. 6 through 9, the trench 311 is formed by trench-etching twice. Specifically, first trench-etching is conducted to the substrate 310, and second trench-etching is conducted after forming the thick first interlayer dielectric 314.

Figure 10:
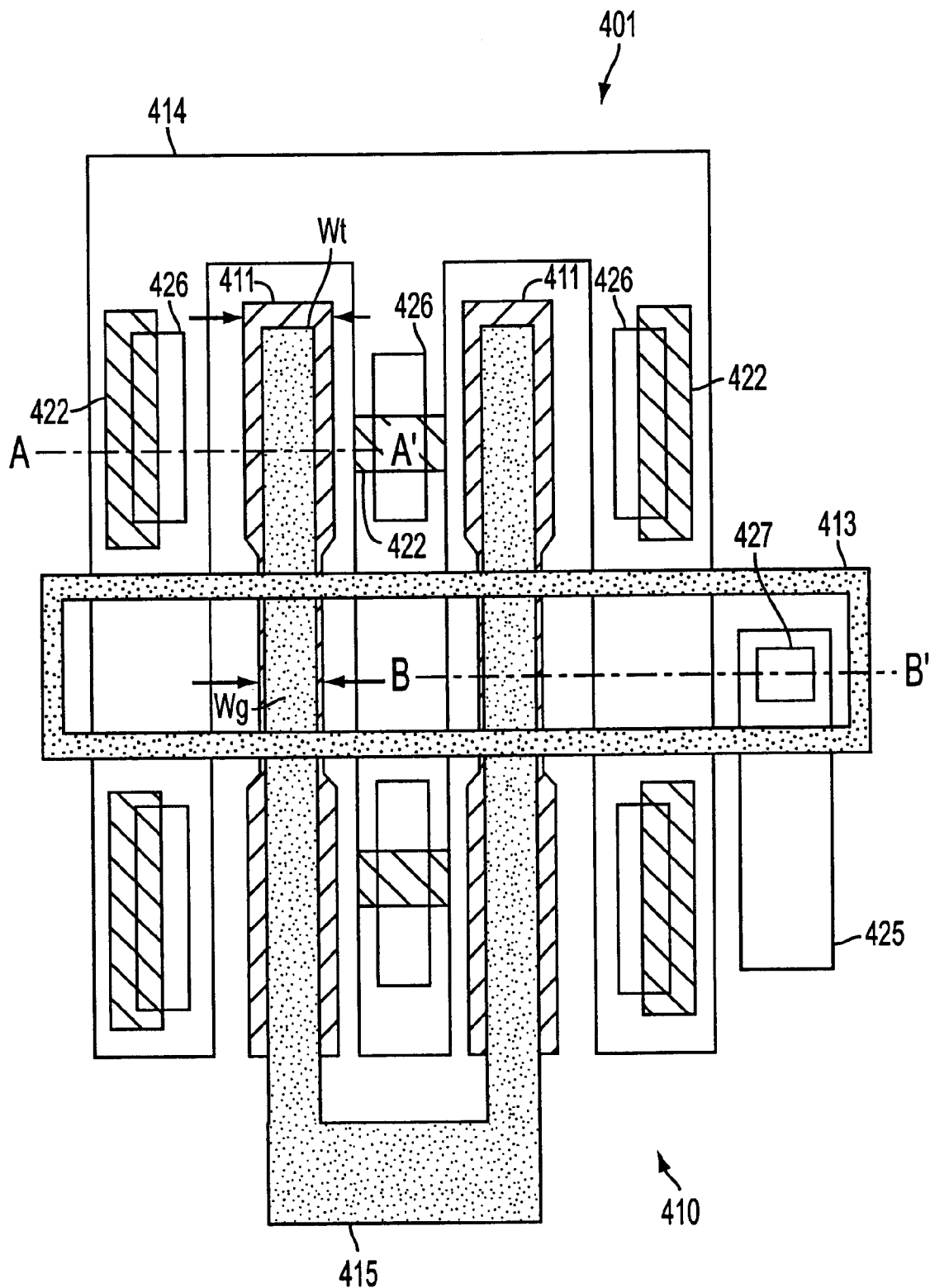
FIG. 10 is a plan view schematically showing another structure of a trench lateral power MOSFET of the first embodiment of the present invention.

FIG. 10 is a plan view showing schematically another structure of a trench lateral power MOSFET according to the first embodiment of the present invention. This trench lateral power MOSFET 401 includes a p-type substrate 410, a plurality of trenches 411 with a stripe shape formed in the substrate, a gate polysilicon 413 crossing the trenches 411, a gate electrode 425 formed on the substrate surface, a source electrode 414 in a comb shape, and a drain electrode 415 in a comb shape.

The gate polysilicon 413 electrically connects to the gate electrode 425 through a contact part 427. The drain electrode 415 is formed almost over the trench 411 and electrically connects to a drain polysilicon in the trench 411 through a contact part omitted in FIG. 10. The drain polysilicon electrically connects to a drain region that is an n-type diffusion region at the trench bottom. The source electrode 414 electrically connects to a source region that is an n-type diffusion region through a contact part 426. Reference numeral 422 in FIG. 10 is a p-type diffusion region.

With Wt being a trench width in the active region in which electric current is driven in a MOSFET operation, and with Wg being a trench width in the gate region in which gate polysilicon is lead out to a substrate surface, Wg is smaller than Wt, like in the trench lateral power MOSFET 101 described earlier. Namely, the width of the trench 411 is narrower in the gate region than in the active region. A trench lateral power MOSFET having such a construction will be described regarding cross sectional constructions in the active region and in the gate region in the following, with reference to specific examples. In the third and fourth examples below, the cross sectional structure in the active region is an example of sectional structures along line A–A' of FIG. 10, and the cross sectional structure in the gate region is an example of sectional structures along line B–B' of FIG. 10.

Figure 11:
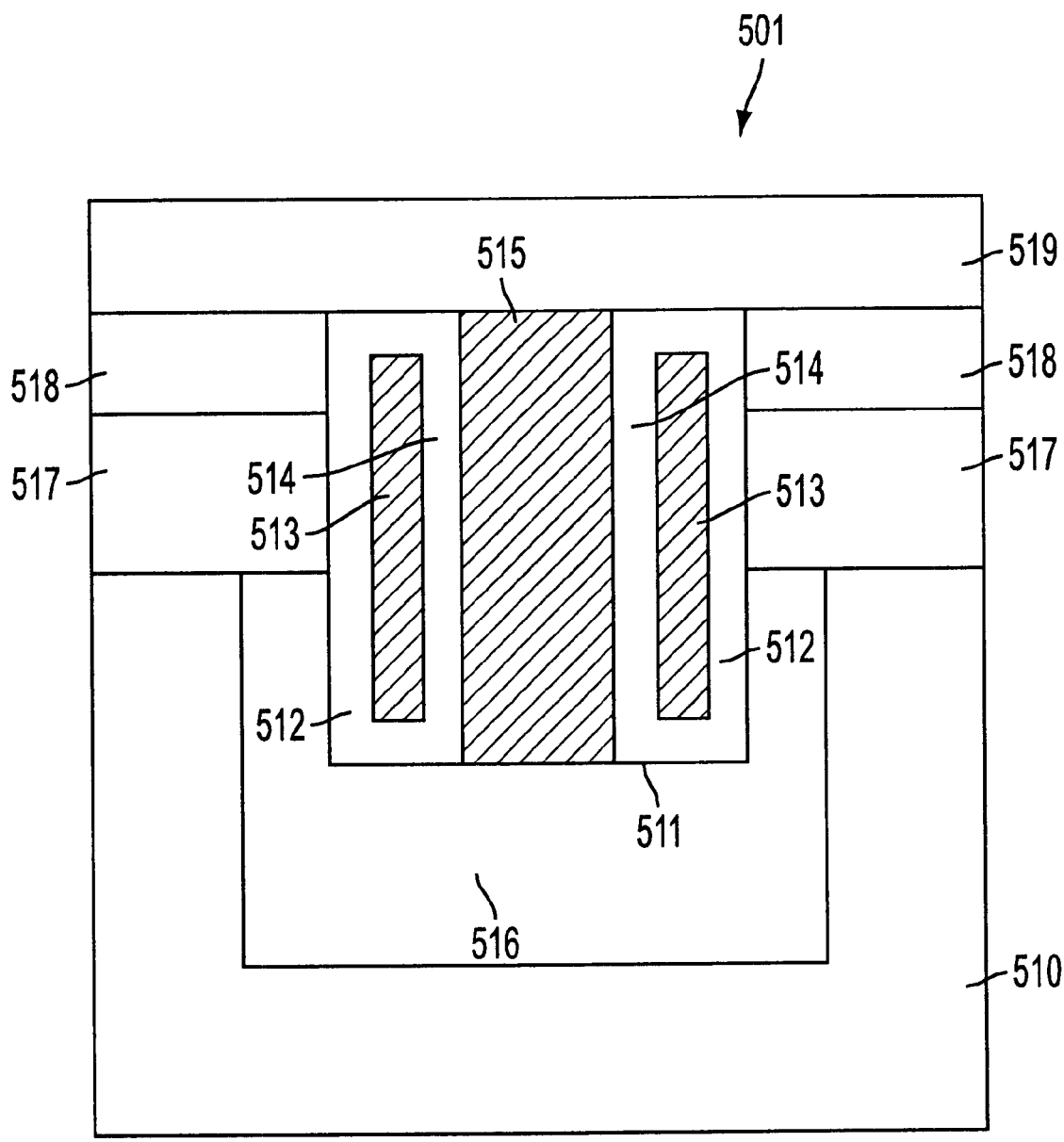
FIG. 11 is a cross-sectional view schematically showing the sectional structure along line A–A' of FIG. 10, of a third example of the trench lateral power MOSFET according to the first embodiment of the present invention.

FIG. 11 is a cross-sectional view showing schematically a sectional structure of the active region in the third example. In the active region of a trench lateral power MOSFET 501 of the third example, a gate oxide film 512 is formed on an inner surface of a trench 511 formed in a p-type substrate 510, gate polysilicon 513 is formed inside the gate oxide film 512, first interlayer dielectric 514 is formed inside the gate polysilicon 513, and drain polysilicon 515 fills the space inside the first interlayer dielectric 514. The drain polysilicon 515 is provided running vertically in the trench 511. Examples of thickness of films are: gate oxide film 512, 0.05 μm, gate polysilicon 513, 0.3 μm, and first interlayer dielectric 514, 0.3 μm. An optimum contact width would be 1 μm, for example.

Around the lower portion of the trench 511, n-type drain region 516 is formed that electrically connects to the drain polysilicon 515. A p base region 517 and a second n-type diffusion region 518 are formed on the surface region of the substrate outside the trench 511. Upper surface of the substrate is coated with interlayer dielectric 519. Through contact holes (not shown in FIG. 11), which are opened through this interlayer dielectric 519, the drain polysilicon 515, the gate polysilicon 513, and the second n-type diffusion region 518 electrically connect to a drain electrode, a gate electrode, and a source electrode, respectively, although the electrodes are omitted from the figure.

In this example, the trench width in the active region Wt is in the range from 1.5 to 4.0 μm. If Wt is less than 1.5 μm, the drain polysilicon 515 is not deposited in the trench 511. That means the n-type drain region 516 formed at the bottom of the trench 511 does not electrically connect to the drain electrode. As a result, a normal operating function of acting as an active region for driving and controlling electric current does not work, if Wt is less than 1.5 μm.

Figure 12:
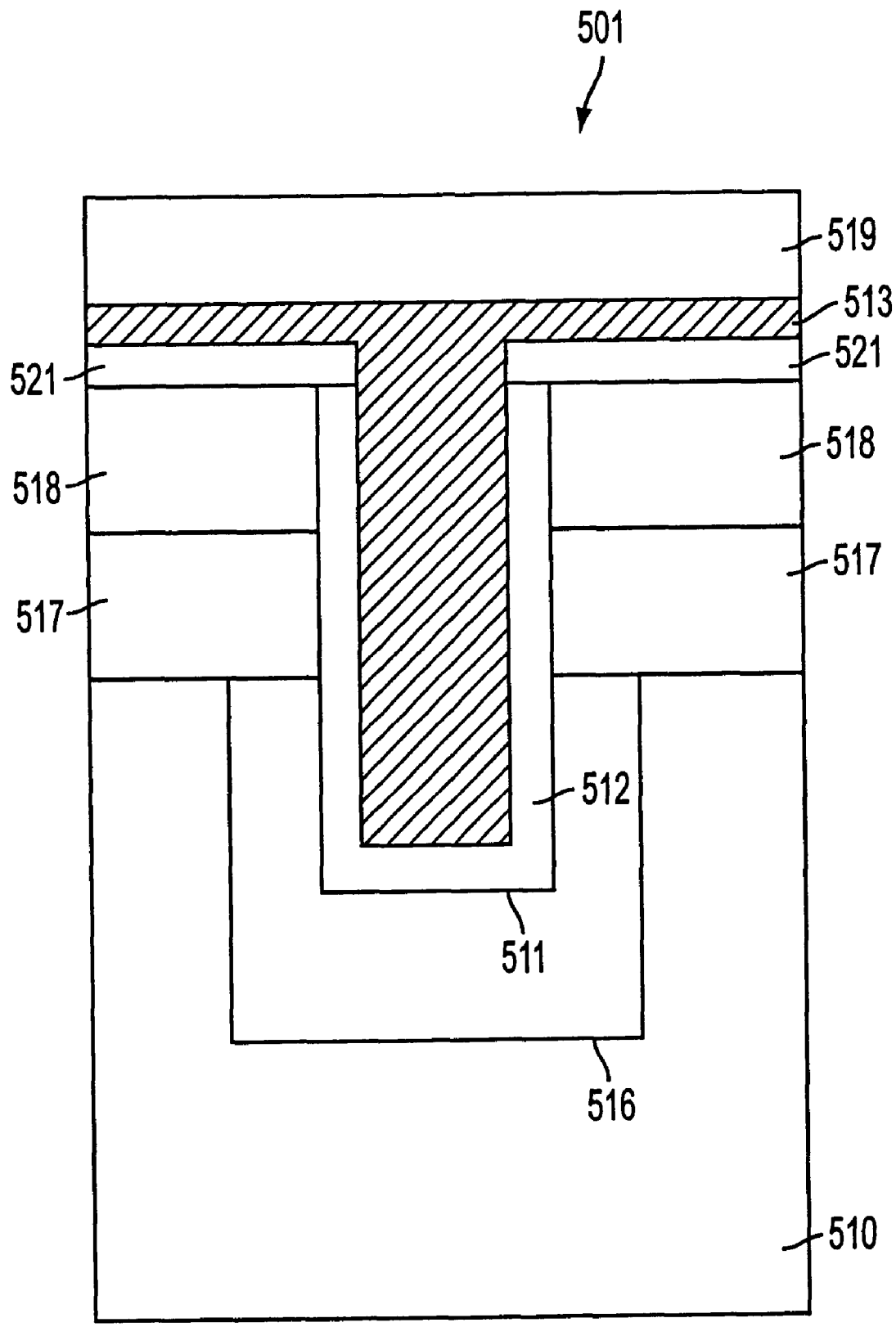
FIG. 12 is a cross-sectional view schematically showing the sectional structure along line B–B' of FIG. 10, of the third example of the trench lateral power MOSFET according to first embodiment of the present invention.
Figure 13:
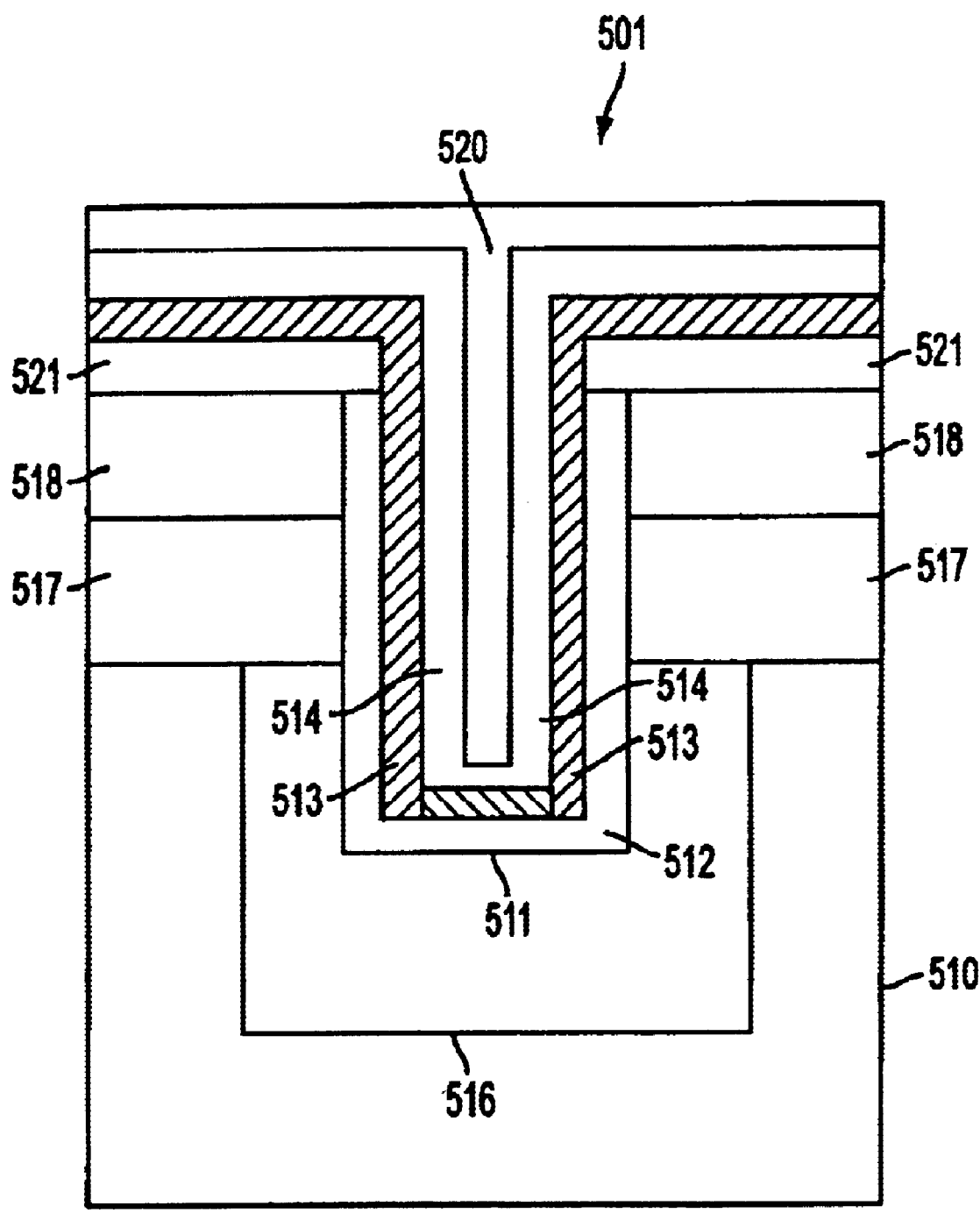
FIG. 13 is a cross-sectional view schematically showing another sectional structure along line B–B' of FIG. 10, of the third example of the trench lateral power MOSFET according to the first embodiment of the present invention.

The structure of the gate region in the third example is shown in FIG. 12 or FIG. 13, depending on the trench width in the gate region Wg. In the case Wg is in the range from 0.2 μm to 0.7 μm, the structure of the gate region is shown in FIG. 12. A gate oxide film 512 is formed on the inside wall of the trench 511, which is formed in a p-type substrate 510. Gate polysilicon 513 fills the space inside the gate oxide film 512. In the case Wg is in the range from 0.7 μm to 1.5 μm, the structure of the gate region is shown in FIG. 13. A gate oxide film 512 is formed on the inside wall of the trench 511. Gate polysilicon 513 is formed inside the gate oxide film 512. The first interlayer dielectric 514 is formed inside the gate polysilicon 513, and the second interlayer dielectric 520 fills the space inside the first interlayer dielectric 514. Thickness of the second interlayer dielectric 520 is 0.4 μm, for example. In FIG. 12 and FIG. 13, reference numeral 521 represents an interlayer dielectric.

In the structure of the gate region as shown in FIG. 12 or FIG. 13, the trench 511 is filled with the gate oxide film 512, the gate polysilicon 513, and the interlayer dielectric 514 and 520, before a step of depositing drain polysilicon. Consequently, after a step of depositing drain polysilicon, the drain polysilicon on the gate region is removed by a process of etchback. As a result, drain polysilicon does not exist in the trench 511 in the gate region. Any gate-drain short-circuit failure is thus avoided in the gate region.

Figure 29:
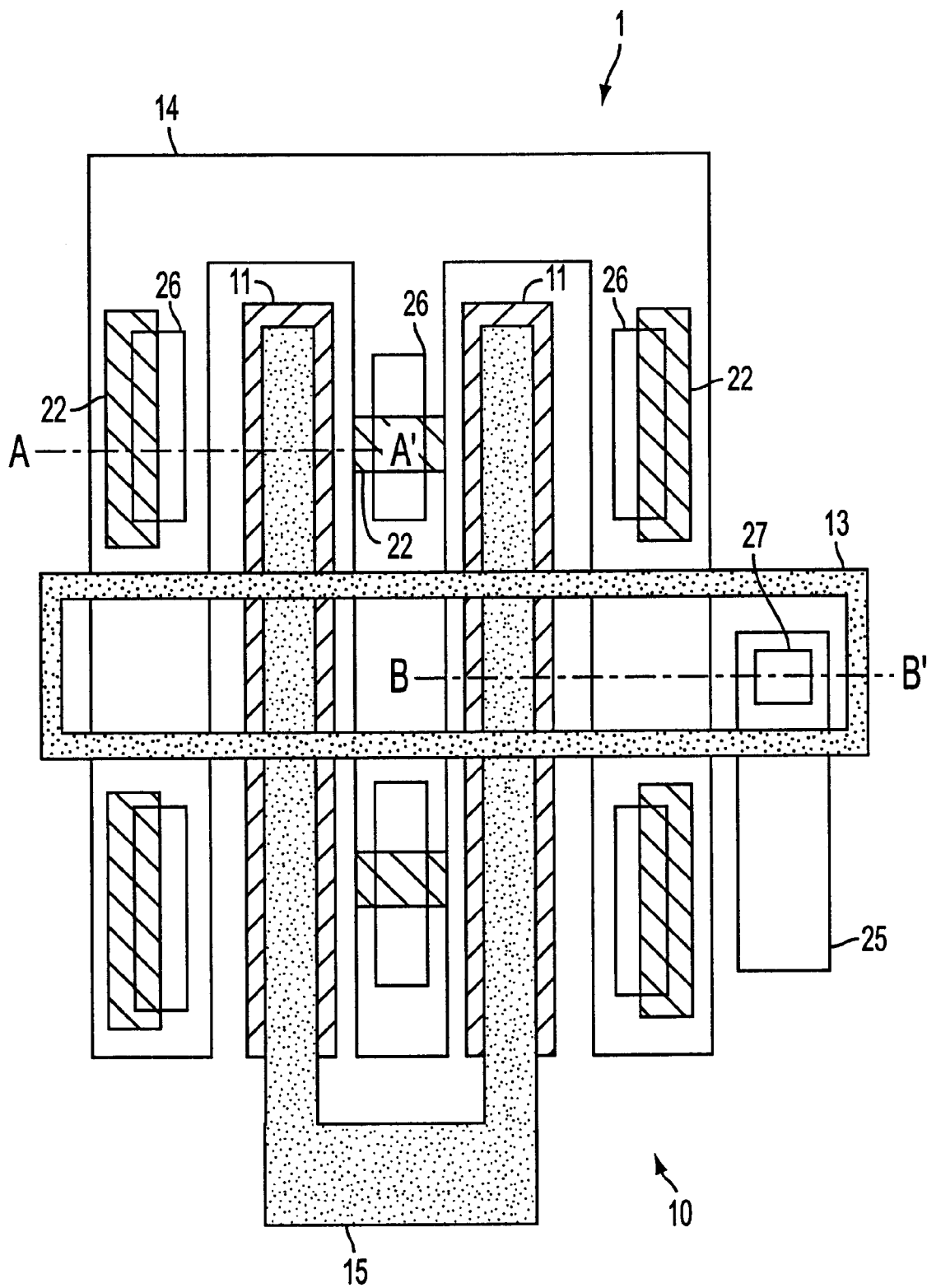
FIG. 29 is a plan view schematically showing a construction of a conventional trench lateral power MOSFET.
Figure 30:
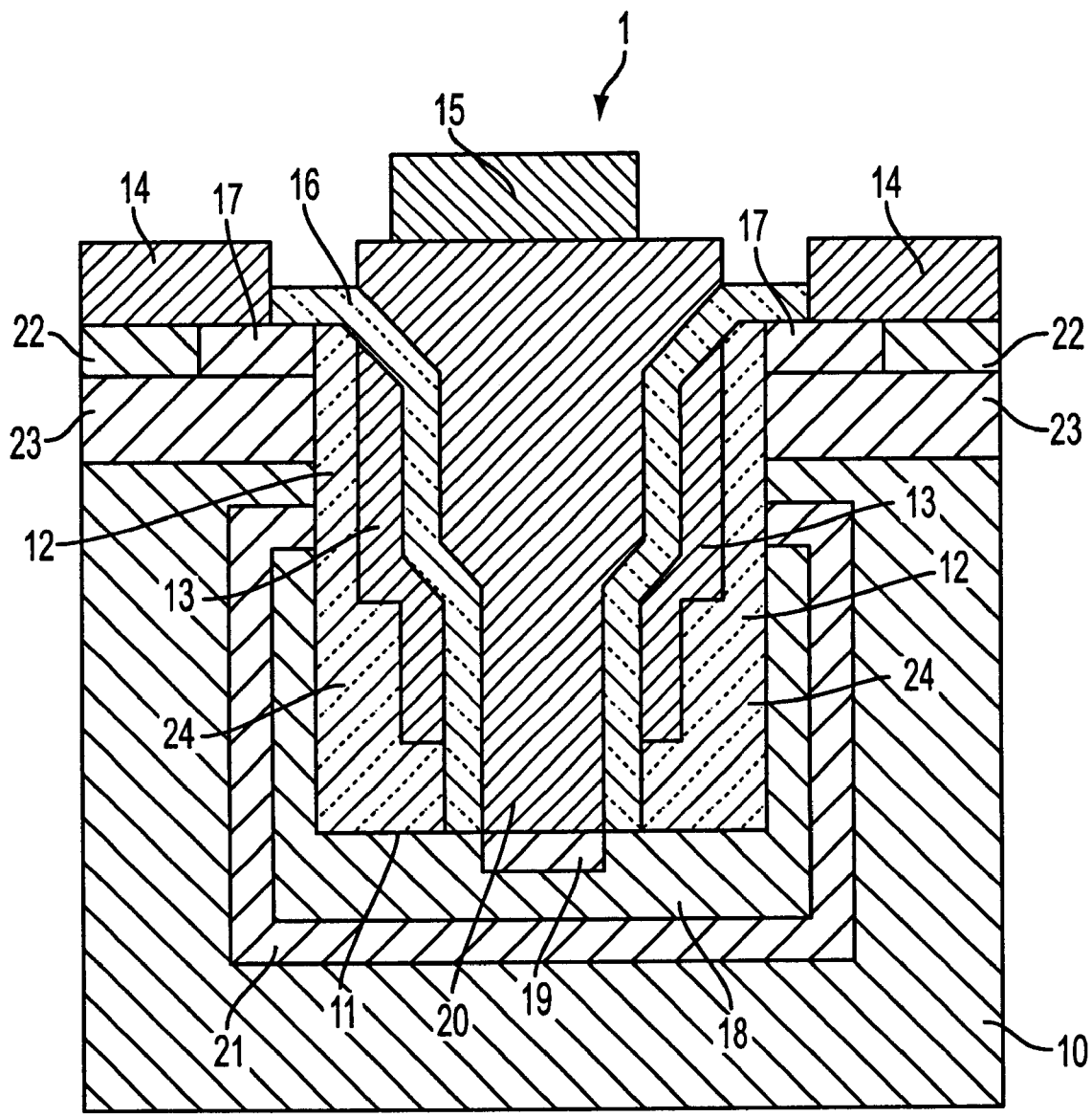
FIG. 30 is a cross-sectional view schematically showing a construction of an active region indicated by line A–A' of FIG. 29.
Figure 31:
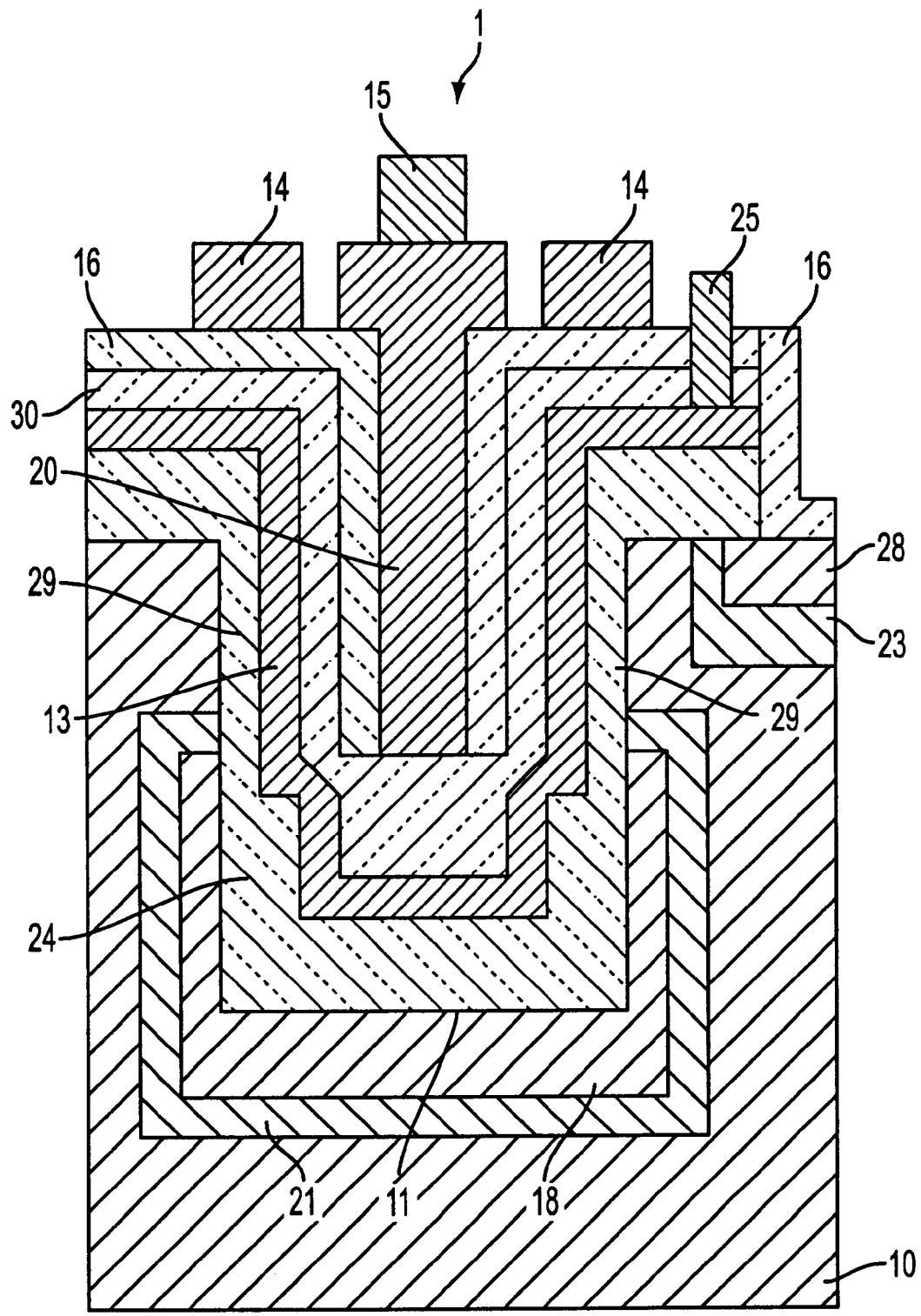
FIG. 31 is a cross-sectional view schematically showing a construction of a gate region indicated by line B–B' of FIG. 29.

If Wg is larger than 1.5 μm in the gate region, drain polysilicon is deposited in the space inside the second interlayer dielectric 520 in the trench 511. An inventor's study showed that gate-drain short-circuit failure occurred at the rate of 90% with the devices in which both the trench width in the active region Wt and the trench width in the gate region Wg are equally 3 μm, that is, with the devices having a uniform trench width of 3 μm as the conventional planar structure of FIG. 29. In contrast, the rate of gate-drain short-circuit failure was 2% or less with the devices in which the trench width in the active region Wt was 3 μm and the trench width in the gate region Wg was 1.5 μm or smaller like a planar structure shown in FIG. 10. In the trench lateral power MOSFET 501 shown in FIGS. 11 through 13, the trench 511 is formed by trench-etching once.

Figure 14:
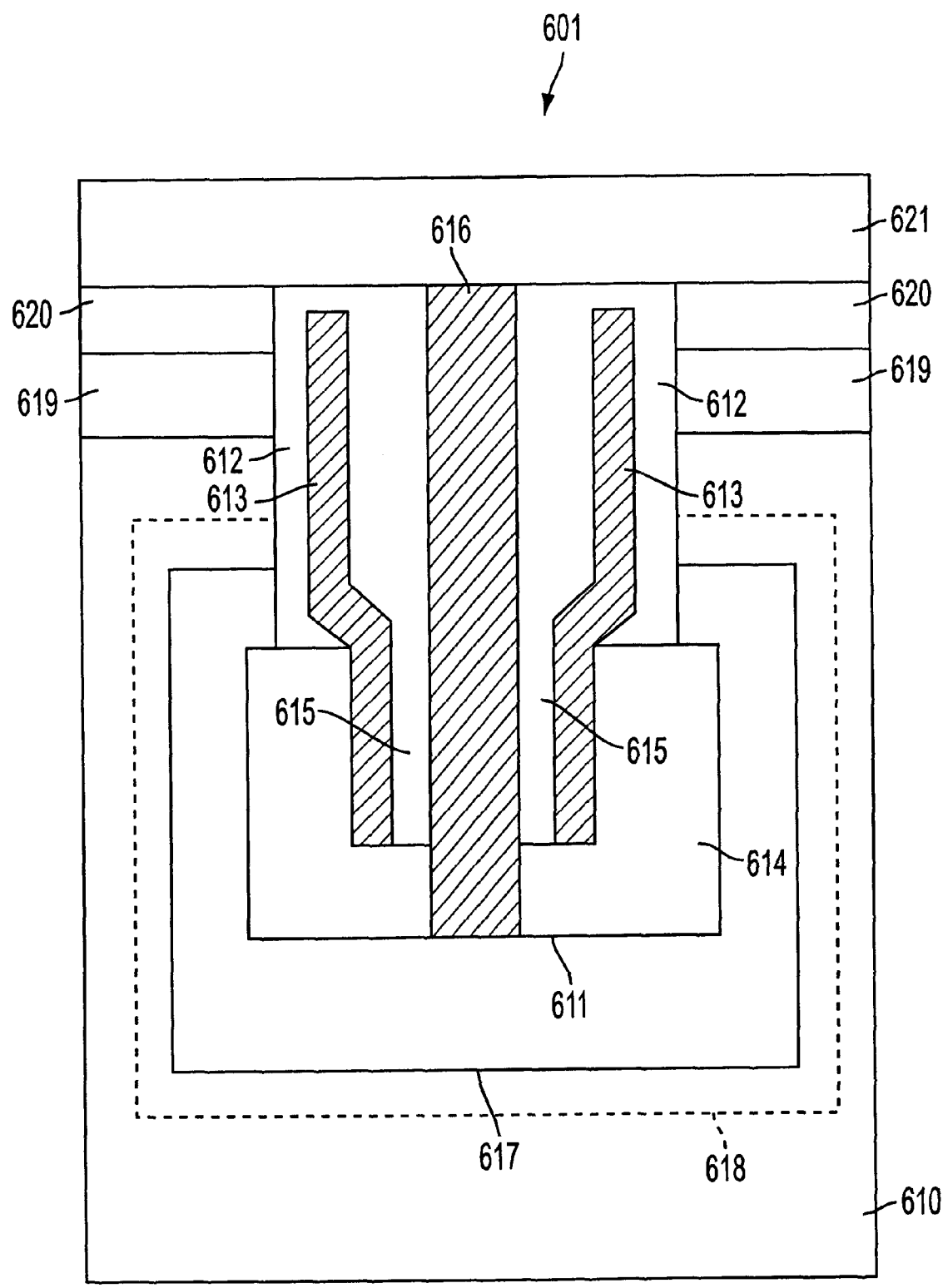
FIG. 14 is a cross-sectional view schematically showing the sectional structure along line A–A' of FIG. 10, of a fourth example of the trench lateral power MOSFET according to the first embodiment of the present invention.

FIG. 14 is a cross-sectional view schematically showing a sectional structure of the active region in the fourth example. In the active region of trench lateral power MOSFET 601 of the fourth example, a trench 611 formed in a p-type substrate 610 is filled with a gate oxide film 612, gate polysilicon 613, first interlayer dielectric 614, third interlayer dielectric 615, and drain polysilicon 616. Numerical examples of thickness of the films are: gate oxide film 612, 0.05 μm, gate polysilicon 613, 0.6 μm, first interlayer dielectric 614, 0.6 μm, and third interlayer dielectric 615, 0.5 μm. The optimum contact width is 1 μm, for example.

The reference numeral 617 in FIG. 14 represents n-type drain region to which the drain polysilicon 616 electrically connects. The symbol 618 represents a p body region, symbol 619 a p base region, symbol 620 second n-type diffusion region, symbol 621 interlayer dielectric. Here, the trench width in the active region Wt is in the range from 3.2 μm to 6.0 μm. If Wt is less than 3.2 μm, the drain polysilicon 616 is not deposited in the trench 611. Then, the function to drive and control current as a normal performance of the active region cannot be obtained.

Figure 15:
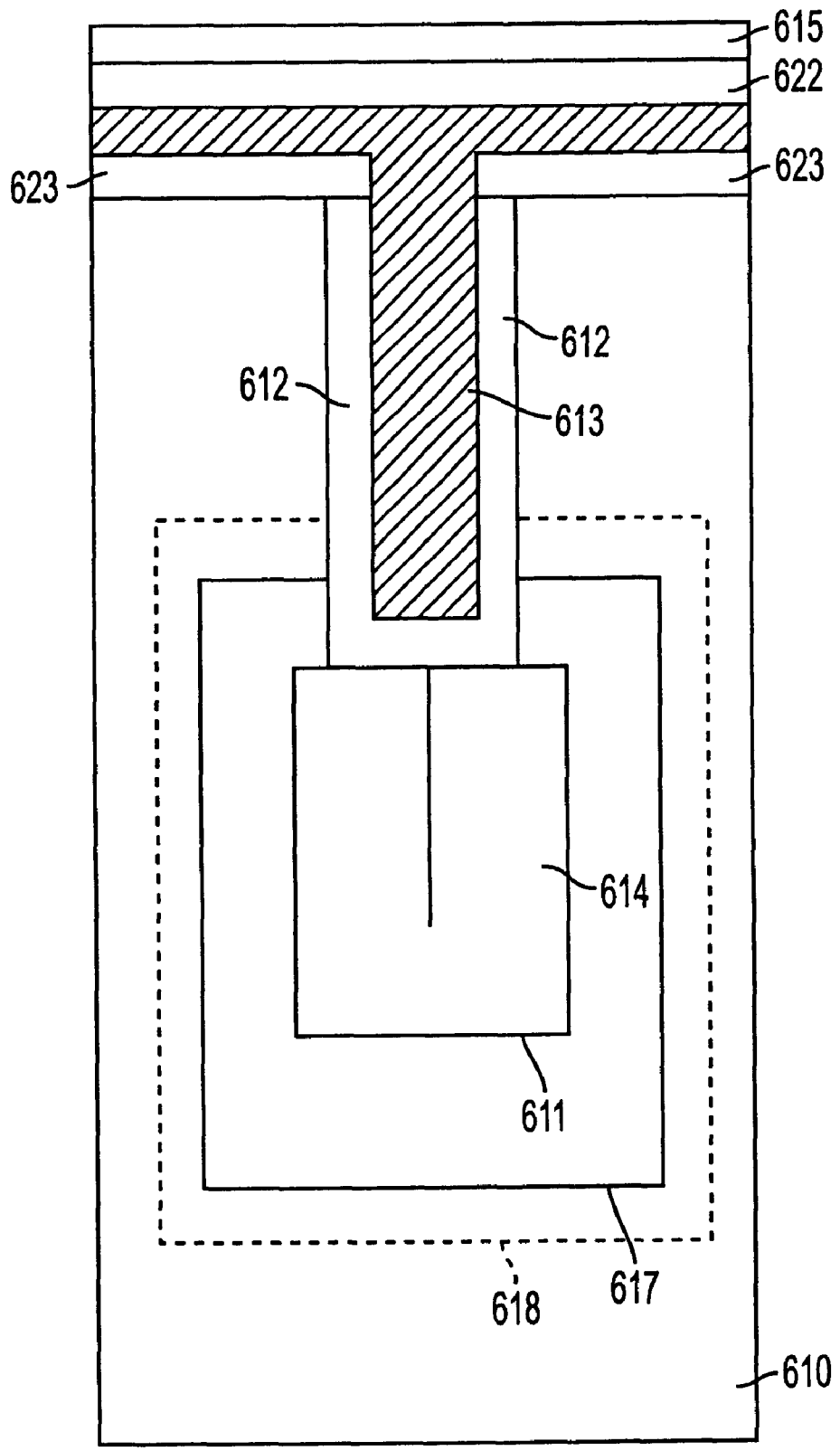
FIG. 15 is a cross-sectional view schematically showing the sectional structure along line B–B' of FIG. 10, of the fourth example of the trench lateral power MOSFET according to the first embodiment of the present invention.
Figure 16:
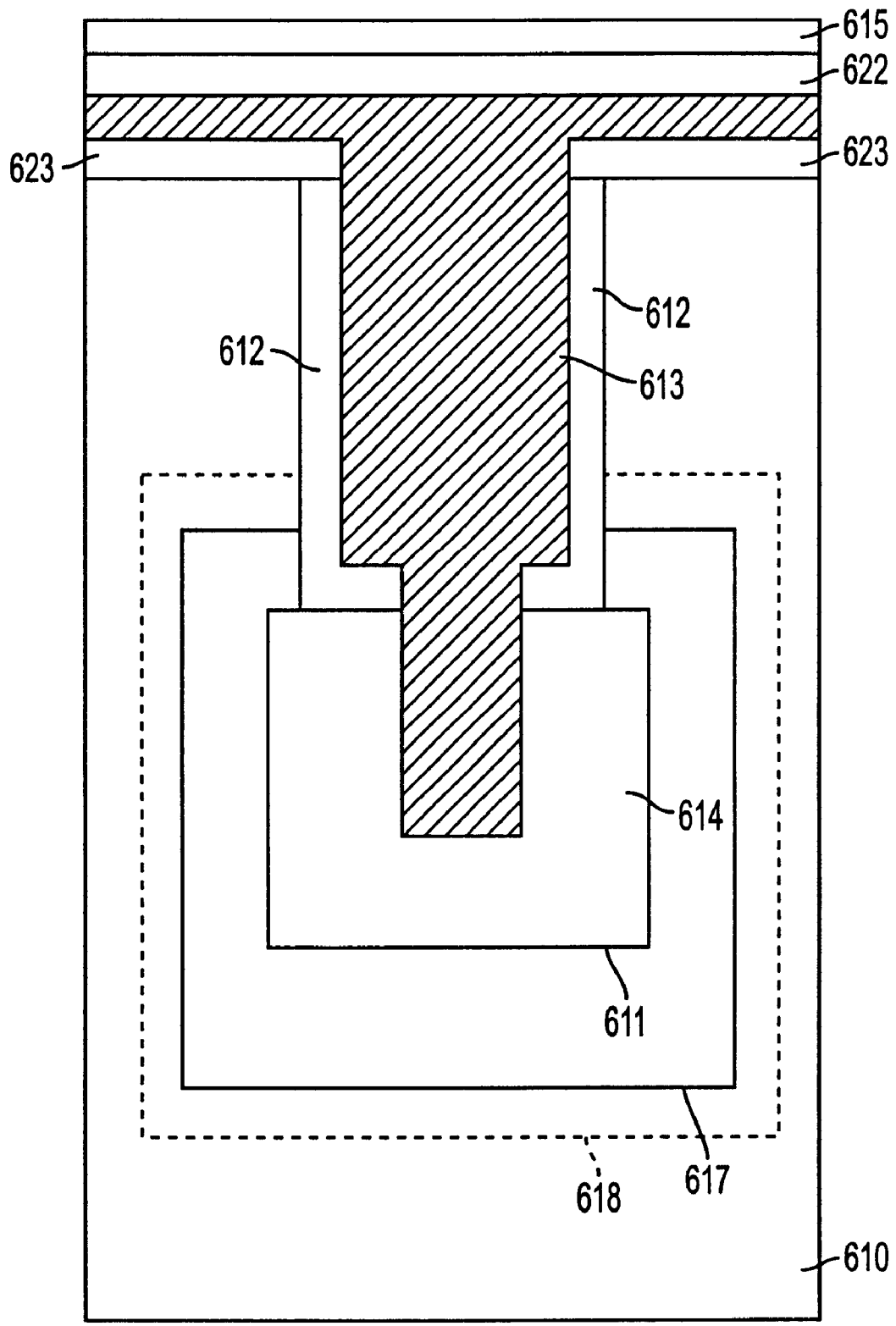
FIG. 16 is a cross-sectional view schematically showing another sectional structure along line B–B' of FIG. 10, of the fourth example of the trench lateral power MOSFET according to the first embodiment of the present invention.
Figure 17:
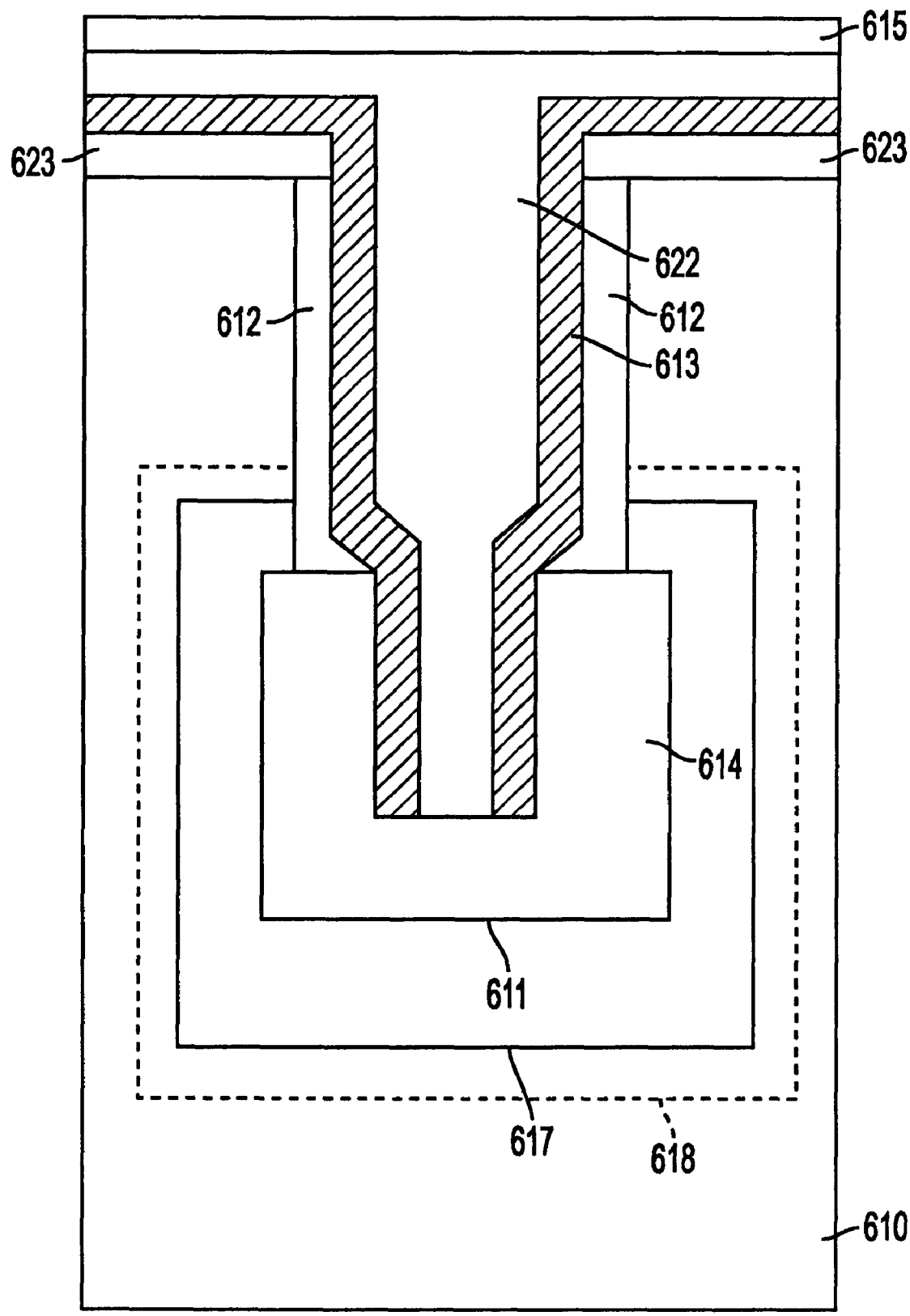
FIG. 17 is a cross-sectional view schematically showing still another sectional structure along line B–B' of FIG. 10, of the fourth example of the trench lateral power MOSFET according to the first embodiment of the present invention.

The structure of the gate region in the fourth example is shown in FIG. 15, FIG. 16, or FIG. 17, depending on the trench width in the gate region Wg. In the case Wg is in the range from 0.2 μm to 1.0 μm, the structure of the gate region is shown in FIG. 15. The trench 611 is filled with the first interlayer dielectric 614. In the case Wg is in the range from 1.0 μm to 2.2 μm, the structure of the gate region is shown in FIG. 16. The trench 611 is filled with the gate oxide film 612, first interlayer dielectric 614, and gate polysilicon 613. In the case Wg is in the range from 2.2 μm to 3.2 μm, the structure of the gate region is shown in FIG. 17. The trench 611 is filled with the gate oxide film 612, first interlayer dielectric 614, gate polysilicon 613, and second interlayer dielectric 622. The thickness of the second interlayer dielectric 622 is 0.3 μm, for example. The reference numeral 623 in FIGS. 15 through 17 represents interlayer dielectric.

In the structure of the gate region as shown in any one of FIGS. 15 through 17, the trench 611 is filled with the gate oxide film 612, the gate polysilicon 613, and interlayer dielectric 614, 622, before a step of depositing drain polysilicon. Consequently, after a step of depositing drain polysilicon, the drain polysilicon on the gate region is removed by a process of etchback. Thus, any gate-drain short-circuit failure is avoided in the gate region.

If Wg is larger than 3.2 μm, drain polysilicon is deposited in the space inside the third interlayer dielectric 615 in the second interlayer dielectric 622 within the trench 611. An inventor's study showed that gate-drain short-circuit failure occurred at the rate of 85% with the devices in which both the trench width in the active region Wt and the trench width in the gate region Wg are equally 5 μm. In contrast, the rate of gate-drain short-circuit failure was not more than 2% with the devices in which the trench width in the active region Wt was 5 μm and the trench width in the gate region Wg was 2.4 μm or smaller. In the trench lateral power MOSFET 601 shown in FIGS. 14 through 17, the trench 611 is formed by trench-etching twice. Specifically, first trench-etching is conducted to the substrate 610, and second trench-etching is conducted after forming the thick first interlayer dielectric 614.

According to the first embodiment of the invention, the trench in the gate region does not include either source polysilicon or drain polysilicon. Therefore, insufficient breakdown voltage nor short-circuit failure does not occur in this embodiment of the present invention, although these poor characteristics have occurred between the gate polysilicon and the source polysilicon or between the gate polysilicon and the drain polysilicon in the conventional devices, in which interlayer insulating film may become very thin or disappear completely.

Figure 18:
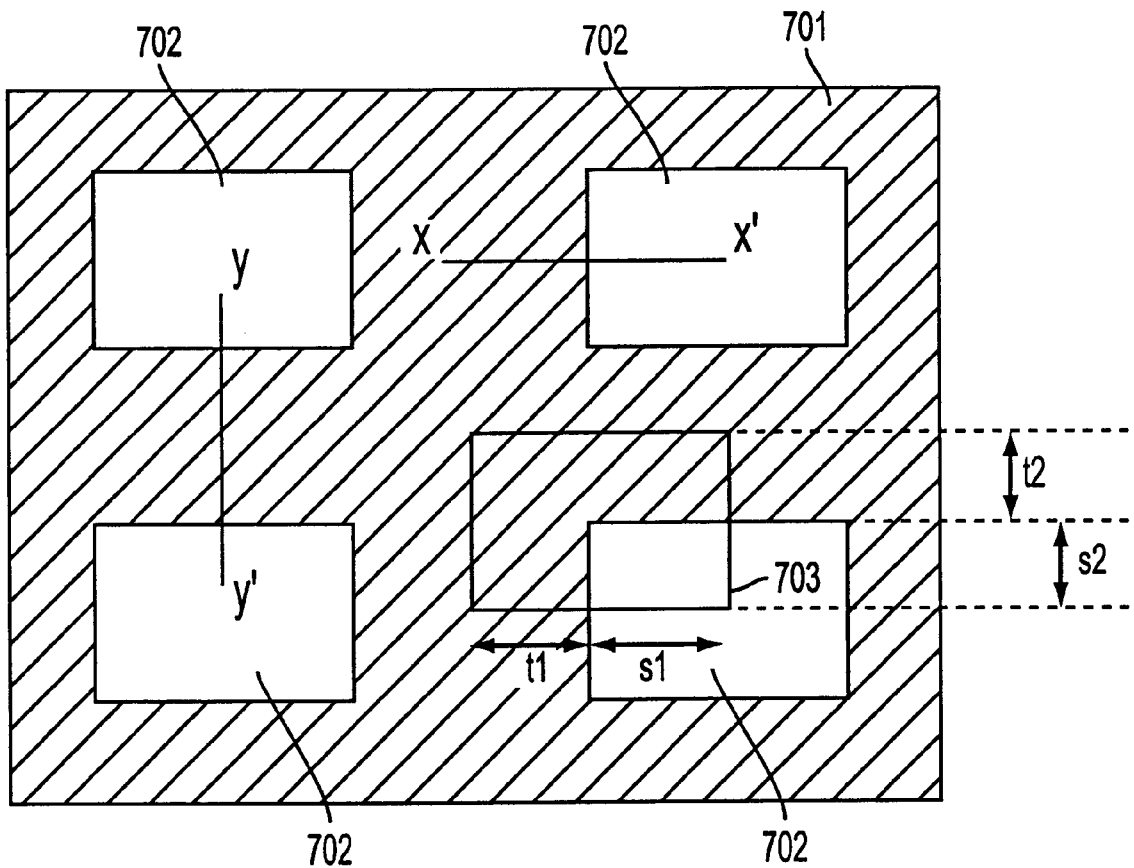
FIG. 18 is a plan view schematically showing a trench lateral power MOSFET according to a second embodiment of the present invention.
Figure 19:
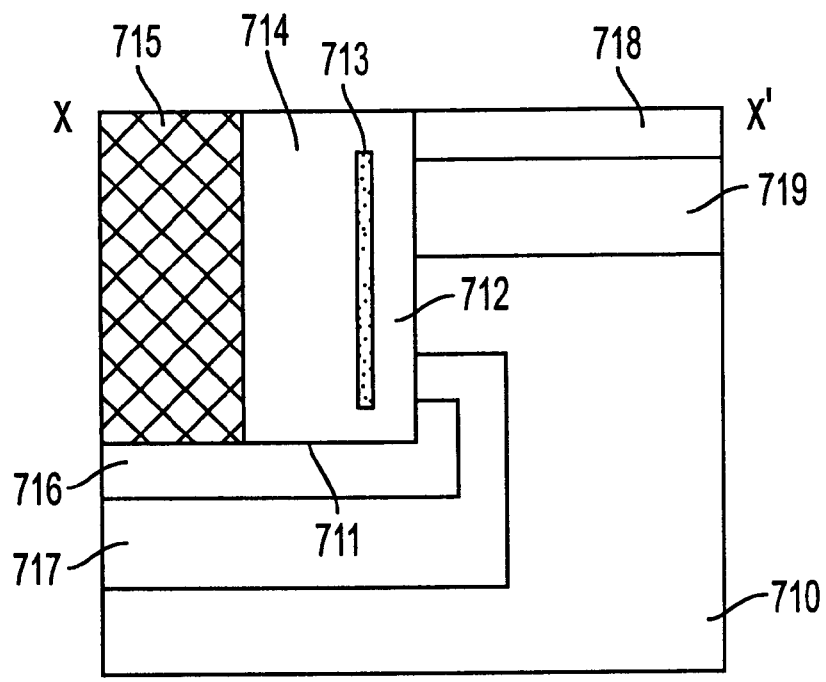
FIG. 19 is a cross-sectional view schematically showing the sectional MOSFET structure along line x–x' of FIG. 18.
Figure 20:
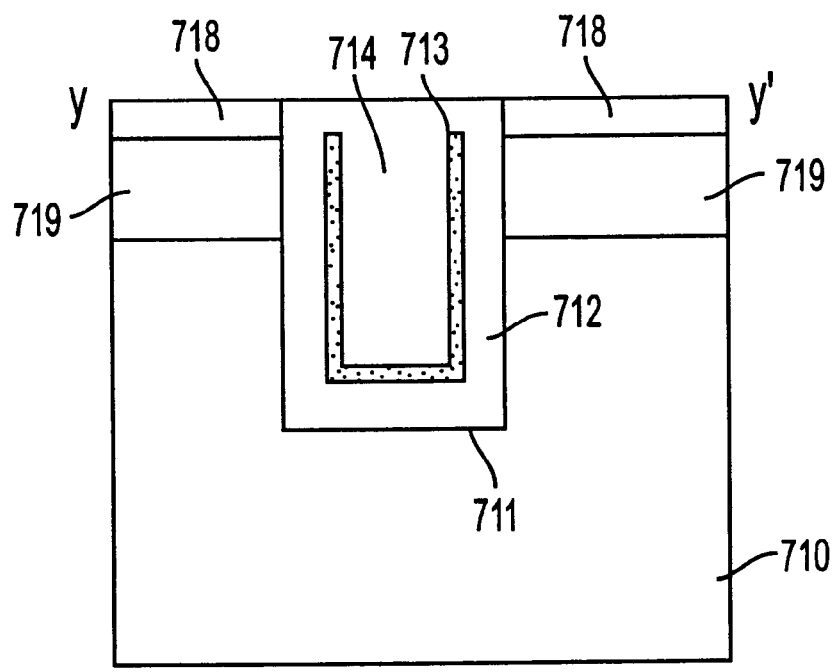
FIG. 20 is a cross-sectional view schematically showing the sectional MOSFET structure along line y–y' of FIG. 18.

FIG. 18 is a plan view schematically showing a trench lateral power MOSFET according to second embodiment of the present invention. FIG. 19 and FIG. 20 are cross-sectional views schematically showing examples of sectional structures along lines x–x' and y–y' of FIG. 18, respectively. A trench lateral power MOSFET of the second embodiment has a planar layout of a mesh pattern as shown in FIG. 18, while its sectional structure is like the structure of any one of the aforementioned first through fourth examples of the first embodiment. In the example shown in FIG. 18, the hatched region is a trench etched region 701 and the region left in an island shape is a non-trench-etched region 702. This planar layout can be formed by leaving a mask oxide film for trench-etching selectively in a rectangular shape.

Explanation of a structure of a device having this planar mesh pattern will be made by taking an example of a trench lateral power MOSFET in which a trench is formed by trench-etching once and a source polysilicon fills a space in the trench, corresponding to the first example of the first embodiment. Consequently, the structure in the active region includes, as shown in FIG. 19, a gate oxide film 712 formed on the side walls of a trench 711 formed in a p-type substrate 710, gate polysilicon 713 formed inside the gate oxide film 712, interlayer dielectric 714 formed inside the gate polysilicon 713, and source polysilicon 715 filling a space inside the interlayer dielectric 714. At the bottom of the trench 711, an n-type first diffusion region 716 and a p base region 717 are formed. The source polysilicon 715 electrically connects to this first diffusion region 716. On a surface region of the substrate outside the trench 711, an n-type second diffusion region 718 and an n-type third diffusion region 719 are formed.

The structure in the gate region includes, as shown in FIG. 20, a gate oxide film 712 formed on the inner walls of the trench 711 that is formed in the p-type substrate 710, gate polysilicon 713 formed inside the gate oxide film 712, and interlayer dielectric 714 filling the space inside the gate polysilicon 713. In this second aspect, the trench width in the gate region Wg is narrower than the trench width in the active region Wt, as in the first embodiment. Accordingly, source polysilicon does not exist in the trench 711 of the gate region. In this planar layout of the mesh pattern, a channel is formed around the non-trench-etched region 702, inside the side walls of the trench 711.

Now a channel width of a rectangular region 703 shown in FIG. 18 is considered. The rectangular region 703 has two sides having length of t1+s1 and another two sides having length of t2+s2 being orthogonal with each other. One of the four corners of the rectangular region 703 is in the non-trench-etched region 702 and the other three corners are in the trench-etched region 701. Here, t1 is the length of a segment falling in the trench-etched region 701 of the side with length t1+s1, and s1 is the length of the other segment falling in the non-trench-etched region 702 of the side with length t1+s1. t2 is the length of a segment falling in the trench-etched region 701 of the side with length t2+s2, and s2 is the length of the other segment falling in the non-trench-etched region 702 of the side with length t2+s2.

The area A of the rectangular region 703 and the channel width Wch are given by the following formulas (1) and (2), respectively. Consequently, the channel width per unit area P is given by formula (3).

$$A = (s1+t1) \times (s2+t2) \quad (1)$$

$$Wch = s1 + s2 \quad (2)$$

$$P = Wch/A \quad (3)$$

The P value represented by formula (3) is larger, with an improved real efficiency, and thus, leading to lower on-resistance. When the trench is formed in the stripe pattern as in the first embodiment, the P value is about $0.4 \times 10^6$ [m$^{-1}$]. In the mesh pattern as shown in FIG. 18 and t1=t2, assuming s1=1.5 μm, s2=0.5 μm, t1=t2=1.5 μm, P value is $0.33 \times 10^6$ [m$^{31\ 1}$], which indicates that the effectiveness of the channel width per unit area in this case is slightly inferior to the stripe pattern in the first embodiment. However, the mesh pattern in the second embodiment allows a structure in which a portion of the gate region corresponding to the dimension t2 is not provided with any contact. In such a structure, t2 may be reduced to 0.5 μm or 0.25 μm, resulting in a larger P value.

Specifically, under the 0.6 μm rule, the dimensions below can be available: s1=1.5 μm, s2=0.5 μm, t1=1.5 μm, and t2=0.5 μm, for example. The resulting P value is $0.67 \times 10^6$ [m$^{-1}$]. Under the 0.35 μm rule, available dimensions are, for example, s1=1.5 μm, s2=0.25 μm, t1=1.0 μm, and t2=0.25 μm, resulting in the P value of $1.4 \times 10^6$ [m$^{-1}$].

Figure 21:
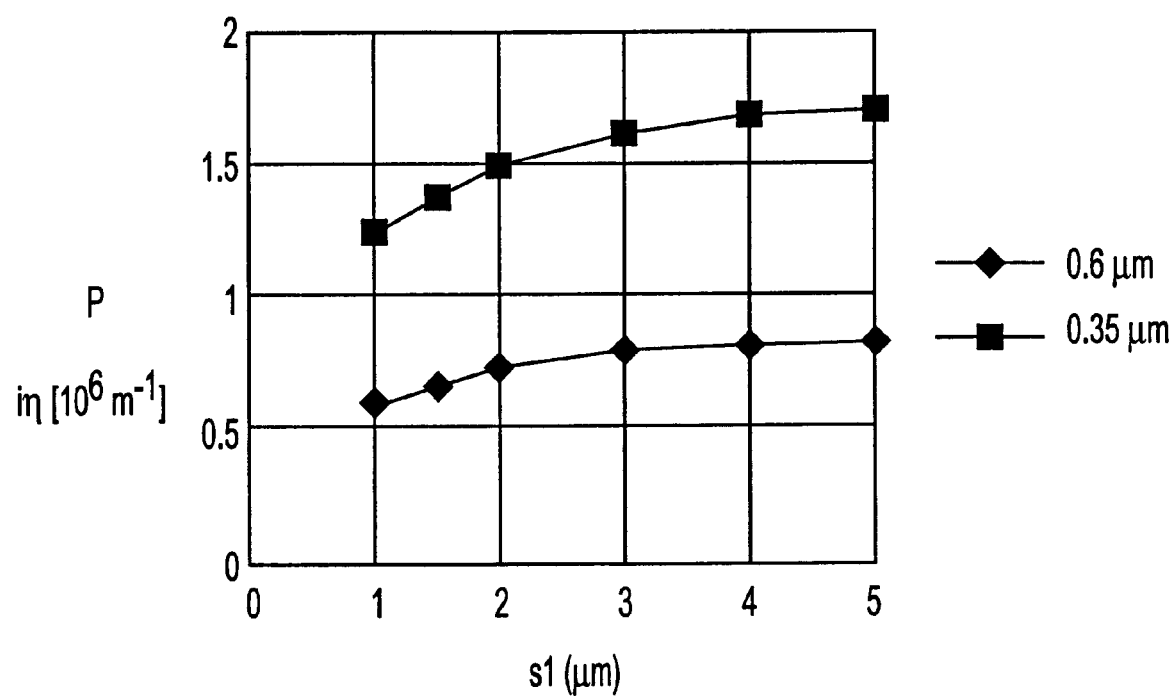
FIG. 21 is a graph showing a relation between the dimension s1 in FIG. 18 and a channel width per unit area P.
Figure 22:
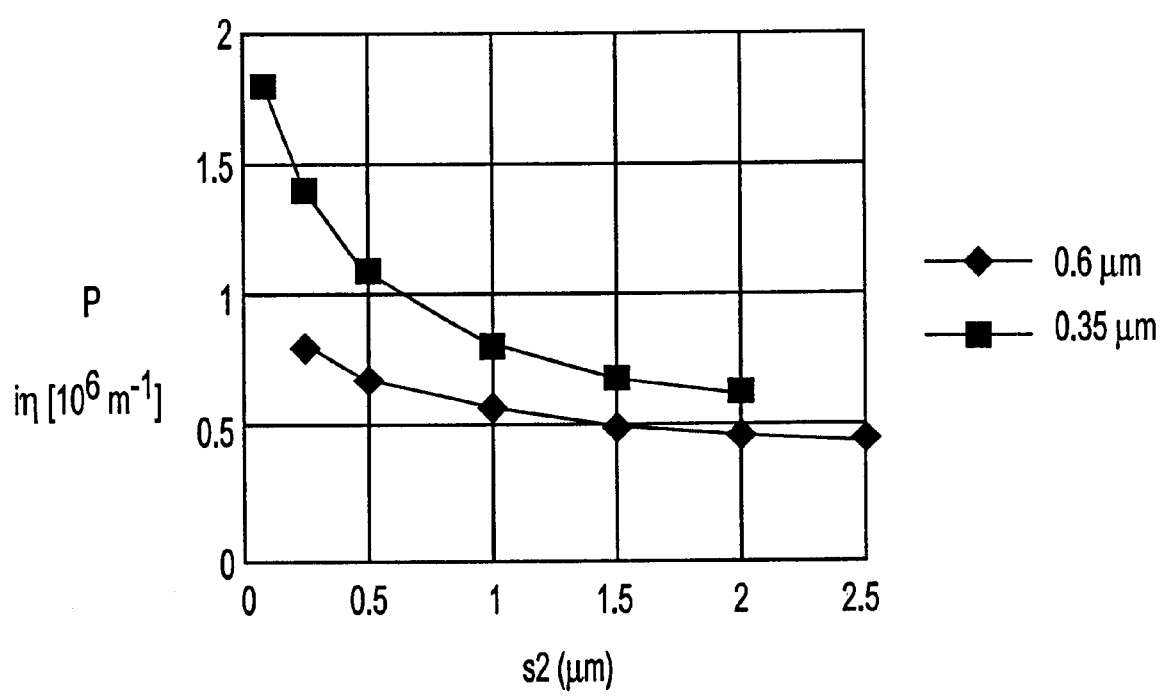
FIG. 22 is a graph showing a relation between the dimension s2 in FIG. 18 and a channel width per unit area P.
Figure 23:
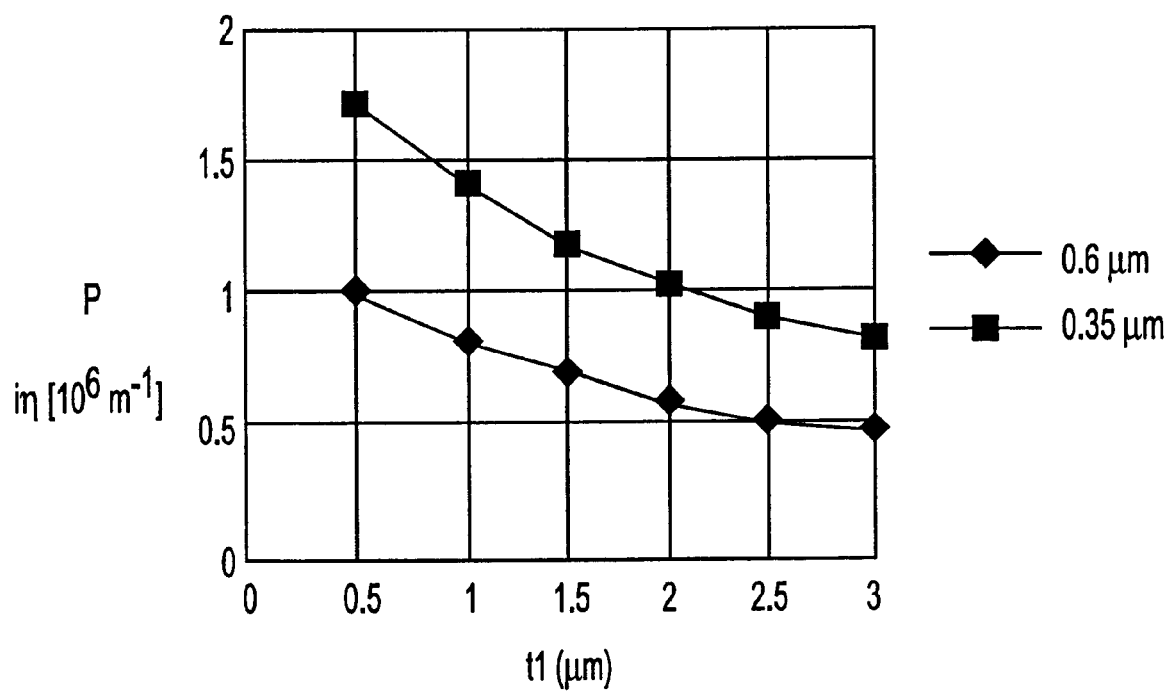
FIG. 23 is a graph showing a relation between the dimension t1 in FIG. 18 and a channel width per unit area P.
Figure 24:
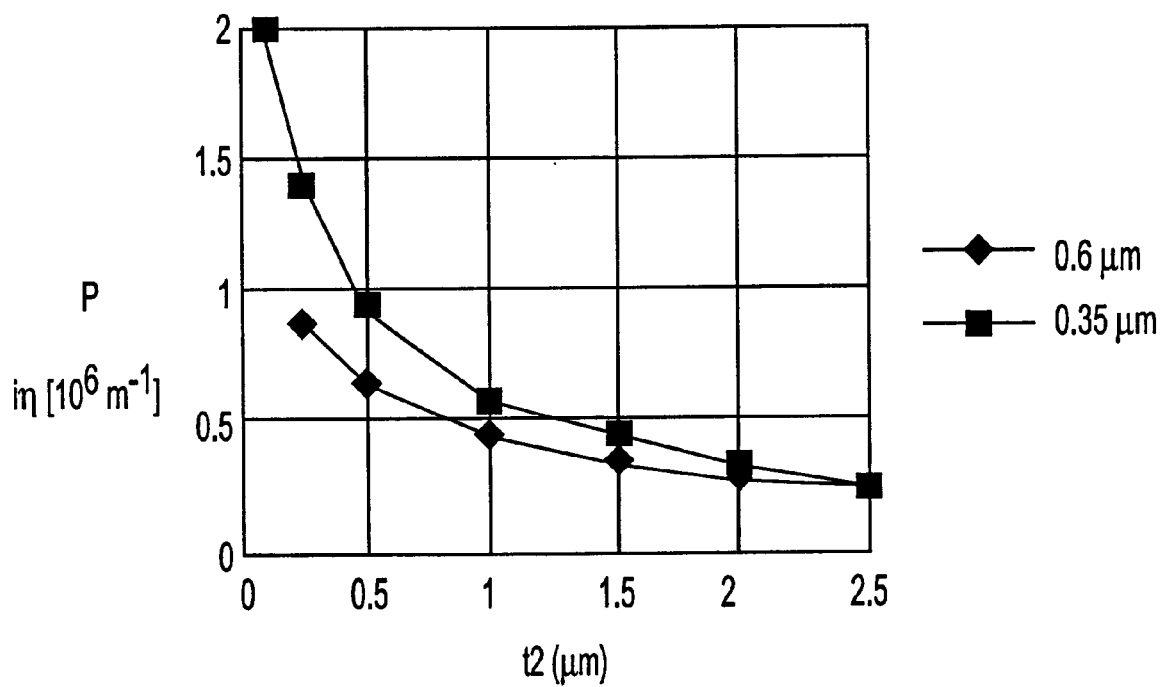
FIG. 24 is a graph showing a relation between the dimension t2 in FIG. 18 and a channel width per unit area P.

FIGS. 21 through 24 are graphs showing relations between the P value and the dimensions s1, s2, t1, and t2. FIG. 21 is a graph showing the relation between the P value and the dimension s1 under the 0.6 μm rule fixing the other dimensions to s2=0.5 μm, t1=1.5 μm, and t2=0.5 μm, and under the 0.35 μm rule fixing the other dimensions to s2=0.25 μm, t1=1.0 μm, and t2=0.25 μm. FIG. 22 is a graph showing the relation between the P value and the dimension s2 under the 0.6 μm rule fixing the other dimensions to s1=1.5 μm, t1=1.5 μm, and t2=0.5 μm, and under the 0.35 μm rule fixing the other dimensions to s1=1.5 μm, t1=1.0 μm, and t2=0.25 μm. FIG. 23 is a graph showing the relation between the P value and the dimension t1 under the 0.6 μm rule fixing the other dimensions to s1=1.5 μm, s2=0.5 μm, and t2=0.5 μm, and under the 0.35 μm rule fixing the other dimensions to s1=1.5 μm, s2=0.25 μm, and t2=0.25 μm. FIG. 24 is a graph showing the relation between the P value and the dimension t2 under the 0.6 μm rule fixing the other dimensions to s1=1.5 μm, s2=0.5 μm, and t1=1.5 μm, and under the 0.35 μm rule fixing the other dimensions to s1=1.5 μm, s2=0.25 μm, and t1=1.0 μm.

As illustrated in FIGS. 21 through 24, P values of $0.8 \times 10^6$ [m$^{-1}$] or more are attained under the 0.6 μm rule and $1.7 \times 10^6$ [m$^{-1}$] or more are attained under the 0.35 μm rule, by appropriately selecting the dimensions s1, s2, t1, and t2. The inventor of the present invention found by his measurement, however, that the actual effect on the on-resistance is about 70% of the effect of the calculated P value. This is because current from the source region or the first n-type diffusion region 716 does not easily flow around along the side wall region of the trench, which is remote from the source polysilicon. Nevertheless, it has been demonstrated that the on-resistance of 6 mΩ-mm$^2$ is achieved under the 0.6 μm rule, and 3 mΩ-mm$^2$ is achieved under the 0.35 μm rule.

The descriptions about the second embodiment as given so far also apply to other types of trench lateral power MOSFETs: a MOSFET in which a trench is formed by trench-etching twice and the space in the trench is filled with source polysilicon, corresponding to the second example according to the first embodiment; a MOSFET in which a trench is formed by trench-etching once and the space in the trench is filled with drain polysilicon, corresponding to the third example according to the first embodiment; and a MOSFET in which a trench is formed by trench-etching twice and the space in the trench is filled with drain polysilicon, corresponding to the fourth example according to the first embodiment. Descriptions concerning these types of MOSFETs are omitted without repeating similar descriptions.

Now, a description will be made about parasitic capacity. Parasitic capacity Cgd that develops between a gate and a drain sandwiching a gate oxide film adversely affects switching characteristics of a device. The parasitic capacity can be suppressed according to the second embodiment.

First, a trench lateral power MOSFET is considered that has a sectional structure in which a trench is formed by trench-etching twice and a space in the trench is filled with source polysilicon. The device corresponds to the second example in the first embodiment. When the device has a planar layout of the mesh pattern shown in FIG. 18, and if the numerical value of (t2×2) is in the range from 0.5 μm to 1.2 μm, then, the trench in the gate region includes only a thick oxide film. In other words, neither gate polysilicon nor source polysilicon exists within the trench in the gate region. Consequently, a channel is not formed in this region. Thus, electron current from the source polysilicon also flows through an n-type drift region 321 at the side of the trench that does not include a channel.

The resistance in the n-type drift region is dominant in this structure of a trench lateral power MOSFET. Accordingly, the width of the drift region is preferably large in comparison with the channel width. For example, s1=1.5 µm and s2=0.5 µm, then, the ratio (channel width/drift region width)=s2/(s1+s2)=0.25. Like this example, the ratio of channel width to drift region width can be made small. As a result, the parasitic capacity developing between the gate and the drain Cgd is suppressed and low on-resistance is achieved. The value of Cgd in this example, having a planar layout of the mesh pattern, is reduced to about 50% of a MOSFET having the same sectional structure and a stripe planar pattern.

Next, another trench lateral power MOSFET is considered that has a sectional structure in which a trench is formed by trench-etching once and a space in the trench is filled with drain polysilicon. The device corresponds to the third example in the first embodiment. When the device has a planar layout of the mesh pattern shown in FIG. 18, an overlap capacity developing between opposing gate polysilicon and drain polysilicon may be concerned about as an origin of gate-drain parasitic capacity Cgd. In the case in which a trench is formed by trench etching once, a channel region is formed around the trench. A drain polysilicon, however, is formed only in a wider region between non-trench-etched regions. Hence, this type of capacity in the mesh pattern of FIG. 18 is developed only in the active region, that is, the x–x' portion of FIG. 18. Thus, the Cgd is suppressed with respect to channel width Wch.

The resistance in the channel region is dominant in this structure of a trench lateral power MOSFET. Accordingly, the channel width is preferably large. For example, s1=1.5 µm, s2=0.5 µm, and t2=0.5 µm, then, the ratio (opposing width between gate polysilicon and drain polysilicon/channel width)=(s2+t2)/(s1+s2)=0.5. Like this example, the ratio (opposing width between gate polysilicon and drain polysilicon/channel width) can be made small. As a result, the parasitic capacity developing between the gate and the drain Cgd in this example, having a planar layout of the mesh pattern, is reduced to about 70% of a MOSFET having the same sectional structure and a stripe planar pattern.

Specific examples will be described below having a basic planar layout of the mesh pattern shown in FIG. 18.

Figure 25:
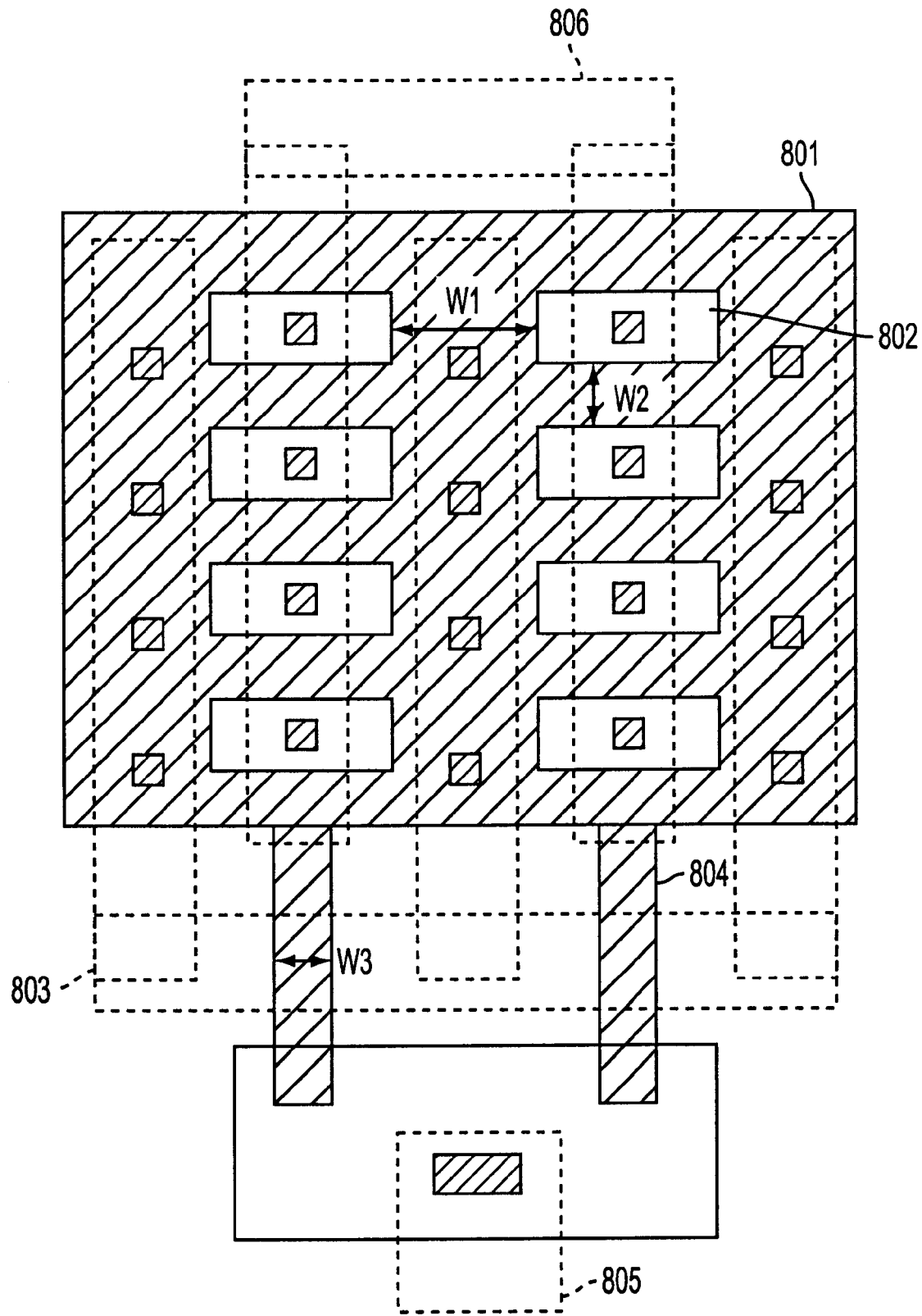
FIG. 25 is a plan view schematically showing a planar layout in a fifth example of a trench lateral power MOSFET according to the second embodiment of the present invention.

FIG. 25 shows a fifth example of a mesh pattern in which non-trench-etched regions 802 is left in an island shape within a trench-etched region 801 in a mesh shape. In FIG. 25, W1 indicates an active region and a source electrode 803 is disposed there. W2 and W3 indicate a gate region, and the trench width is smaller than W1. Gate polysilicon 804 formed in the side wall region of the trench is joined at every side of the trench and connects to gate electrode 805. In FIG. 25, the reference numeral 806 represents a drain electrode, and small squares indicate contacts.

Figure 26:
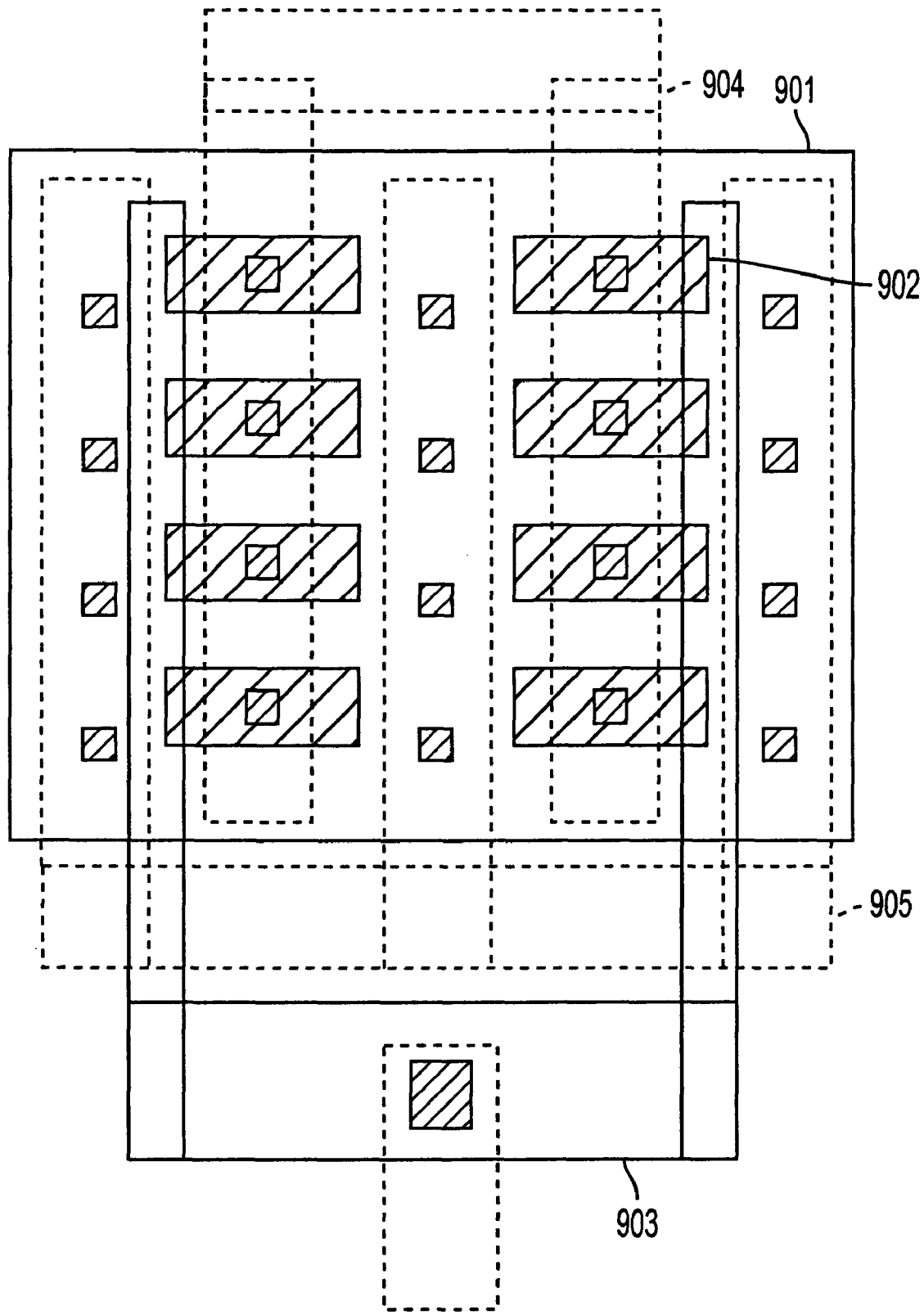
FIG. 26 is a plan view schematically showing a planar layout in a sixth example of a trench lateral power MOSFET according to the second embodiment of the present invention.

FIG. 26 shows a sixth example of a mesh pattern in which trench-etched regions 902 are formed in an island shape within a non-trench-etched region 901 in a mesh shape. Gate electrode 903 is lead out by patterning gate polysilicon. In FIG. 26, reference numerals 904 and 905 represent a source electrode and a drain electrode, respectively, and small squares indicate contacts.

Figure 27:
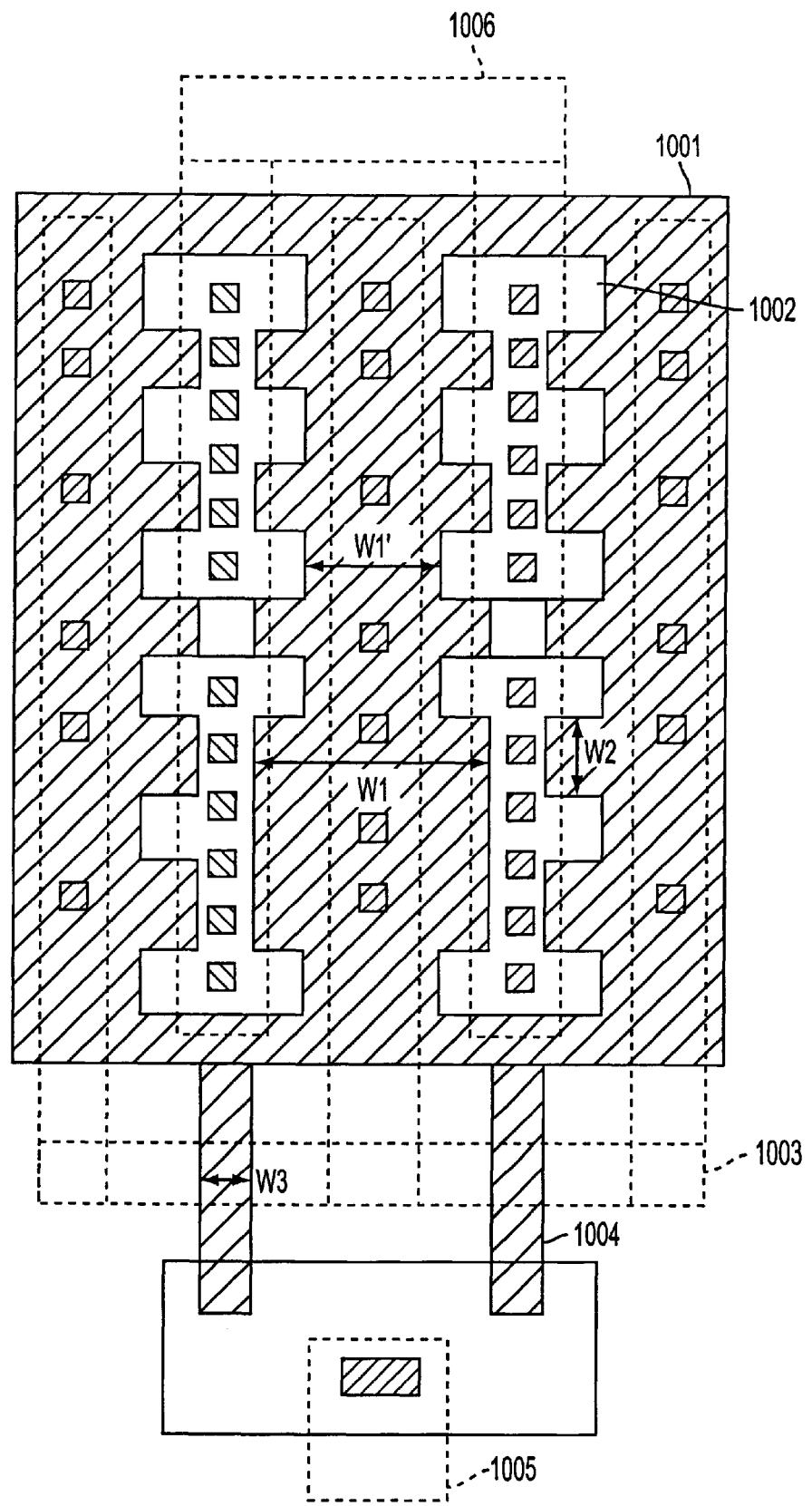
FIG. 27 is a plan view schematically showing a planar layout in a seventh example of a trench lateral power MOSFET according to the second embodiment of the present invention.

FIG. 27 shows a seventh example of a mesh pattern in which non-trench-etched region 1002 is left in a ribbed shape within a trench-etched region 1001 in a nearly mesh shape. W1 in FIG. 27 indicates an active region and source electrode 1003 is disposed there. A rib is not formed and W1 is made large here. W2 and W3 indicate a gate region, and the trench width is smaller than W1. Gate polysilicon 1004 formed in the side wall region of the trench connects to gate electrode 1005. In FIG. 27, the reference numeral 1006 represents a drain electrode, and small squares indicate contacts. An active region may be formed in a planar layout having ribs, as indicated by W1' in FIG. 27, in which the tips of ribs are sufficiently apart from each other.

Figure 28:
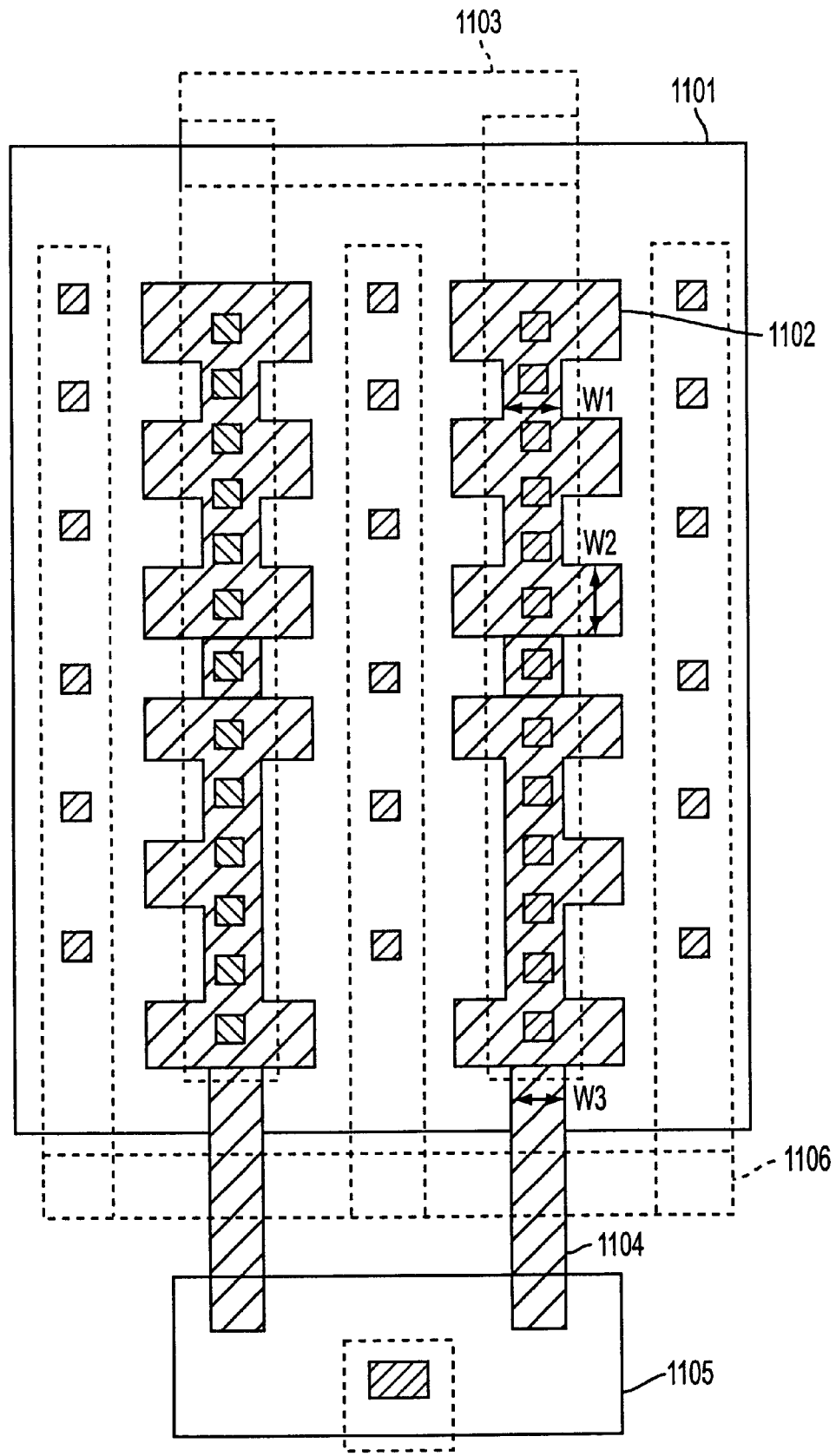
FIG. 28 is a plan view schematically showing a planar layout in an eighth example of a trench lateral power MOSFET according to the second embodiment of the present invention.

FIG. 28 shows an eighth example of a mesh pattern in which trench-etched region 1102 is formed in a lamellar shape within a non-trench-etched region 1101 in a nearly mesh shape. W1 in FIG. 28 indicates an active region, and source electrode 1103 is disposed there. W2 and W3 indicate a gate region, and the trench width is smaller than W1. In FIG. 28, the reference numeral 1104 represents a gate polysilicon, 1105 a gate electrode, 1106 a drain electrode, and small squares indicate contacts.

According to the above-described second embodiment, a trench-etched region or a non-trench-etched region is in an island shape or a ribbed shape. Consequently, channel width or extended drain width per unit area of a MOSFET increases, resulting in reduction of on-resistance per unit area. When trench width is decreased in the region without contact, channel width or extended drain width per unit area of a MOSFET further increases and thus, on-resistance per unit area decreases further.

In a trench lateral power MOSFET having a sectional structure in which a trench is formed by trench-etching twice and a space in the trench is filled with source polysilicon, parasitic capacity developing between a gate and a drain is suppressed by forming the trench-etched region in a mesh shape and reducing the trench width in the region without contact according to the above-described second embodiment. Thus, the width of the n-type drift region at the side wall region of the trench increases without increasing gate overlap capacity. This results in reduction of resistance in the drift region, which leads to high operational speed and low switching loss of the device.

In a trench lateral power MOSFET having a sectional structure in which a trench is formed by trench-etching once and a space in the trench is filled with drain polysilicon, overlap capacity developing between opposing gate polysilicon and drain polysilicon is suppressed with respect to the channel width by forming the trench-etched region in a mesh shape according to the above-described second embodiment.

According to the second embodiment described above, surface area of a device can be relatively small, thereby reducing parasitic capacity developing between the substrate and the semiconductor element of the device in any of the four types of trench lateral power MOSFETs, namely, the MOSFET having a sectional structure in which a trench is formed by trench-etching once and a space in the trench is filled with source polysilicon, the MOSFET having a sectional structure in which a trench is formed by trench-etching twice and a space in the trench is filled with source polysilicon, the MOSFET having a sectional structure in which a trench is formed by trench-etching once and a space in the trench is filled with drain polysilicon, and the MOSFET having a sectional structure in which a trench is formed by trench-etching twice and a space in the trench is filled with drain polysilicon. In addition, wiring among a gate, a source, and a drain can be made shorter to reduce parasitic wiring resistance. This leads to achieving a high speed switching device and to reducing switching loss of the device. Since a parasitic capacity with the substrate decreases, influence of noises affecting neighboring devices is also reduced.

The present invention shall not be limited to the above-described embodiments and examples, but various modifications are also possible. The exemplified thickness and width shall not limit the invention, but are allowed to be varied. The mesh patterns in the drawings accompanying the descriptions of the fifth through eighth examples are only examples, and planar patterns in the present invention are not limited to those specific examples. The present invention is valid when n-type and p-type are exchanged in the above description. The present invention is not restricted to a trench lateral power MOSFET with a breakdown voltage of in the range between several tens and several hundred volts, but applicable to a trench lateral MOSFET in general.

According to embodiments of the present invention, neither source polysilicon nor drain polysilicon exists in the trench in the gate region. Consequently, troubles in the conventional devices are avoided that are caused by poor withstand voltage or short-circuit failure between a gate polysilicon and a drain polysilicon or between a gate polysilicon and a source polysilicon in the trench in the gate region.

According to embodiments of the present invention, a planar layout is a mesh pattern. Consequently, channel width or extended drain width per unit area of a MOSFET increases to reduce on-resistance per unit area. By decreasing trench width at a portion without contact, the channel width or the extended drain width per unit area of the MOSFET further increases to reduce the on-resistance per unit area further.

In a trench lateral power MOSFET having a sectional structure in which a trench is formed by trench-etching twice and a space in the trench is filled with source polysilicon, parasitic capacity developing between a gate and a drain is suppressed, so that the width of the n-type drift region at the side wall region of the trench increases without increasing gate overlap capacity. This results in a reduction of resistance in the drift region, which leads to high operational speed and low switching loss of the device.

According to embodiments of the present invention, in a trench lateral power MOSFET having a sectional structure in which a trench is formed by trench-etching once and a space in the trench is filled with drain polysilicon, overlap capacity developing between opposing gate polysilicon and drain polysilicon is suppressed with respect to the channel width.

According to embodiments of the present invention, surface area of a device can be relatively small, resulting in reduced parasitic capacity developing between the substrate and the semiconductor element of the device. In addition, wiring among a gate, a source, and a drain can be made shorter, resulting in reduced parasitic wiring resistance. Therefore, a high speed switching device is achieved and switching loss of the device is reduced. Because a parasitic capacity with the substrate decreases, influence of noises affecting neighboring devices is also reduced.

While this invention has been particularly shown and described with reference to preferred embodiments thereof, it will be understood by those skilled in the art that various changes in form and details may be made therein without departing from the spirit and scope of the invention as defined by the appended claims and their equivalents.

What is claimed is:

1. A trench lateral MOSFET, comprising:
   a semiconductor substrate;
   a trench provided in the semiconductor substrate;
   a first diffusion region formed at a bottom of the trench, the first diffusion region functioning as a source region;
   a second diffusion region formed on a surface region of the semiconductor substrate outside the trench, the second diffusion region functioning as a drain region;
   a gate insulating film formed on a side wall region of the trench inside the trench;
   a first conductor formed inside the gate insulating film; and
   a second conductor formed inside the first conductor through an interlayer dielectric and electrically connecting to the first diffusion region, wherein
   the trench in an active region, where current is driven in a MOSFET operation, contains at least the gate insulating film, the first conductor, the interlayer dielectric, and the second conductor, and
   the trench in a gate region, where the first conductor is lead out to a surface of the semiconductor substrate, is filled with at least one material from a group consisting of the gate insulating film, the first conductor, the interlayer dielectric, and another interlayer dielectric.

2. The trench lateral MOSFET of claim 1, further comprising:
   a thick interlayer dielectric having a thickness thicker than a thickness of said gate insulating film, said thick interlayer dielectric being formed adjacent to said gate insulating film and in said second diffusion region side.

3. The trench lateral MOSFET of claim 1, wherein a width of said trench in said gate region is narrower than a width of said trench in said active region.

4. A trench lateral MOSFET, comprising:
   a semiconductor substrate;
   a trench provided in the semiconductor substrate;
   a first diffusion region formed at a bottom of the trench, the first diffusion region functioning as a drain region;
   a second diffusion region formed on a surface region of the semiconductor substrate outside the trench, the second diffusion region functioning as a source region;
   a gate insulating film formed on a side wall region of the trench inside the trench;
   a first conductor formed inside the gate insulating film; and
   a second conductor formed inside the first conductor through an interlayer dielectric and electrically connecting to the first diffusion region, wherein
   the trench in an active region, where current is driven in a MOSFET operation, contains at least the gate insulating film, the first conductor, the interlayer dielectric, and the second conductor, and
   the trench in a gate region, where the first conductor is lead out to a surface of the semiconductor substrate, is filled with at least one material from a group consisting of the gate insulating film, the first conductor, the interlayer dielectric, and another interlayer dielectric.

5. The trench lateral MOSFET of claim 4, further comprising:
   a thick interlayer dielectric having a thickness thicker than a thickness of said gate insulating film, said thick interlayer dielectric being formed adjacent to said gate insulating film and in said first diffusion region side.

6. The trench lateral MOSFET of claim 4, wherein a width of said trench in said gate region is narrower than a width of said trench in said active region.

7. A trench lateral MOSFET, comprising:

a semiconductor substrate;

a trench provided in the semiconductor substrate;

a first diffusion region formed at a bottom of the trench, the first diffusion region functioning as a source region;

a second diffusion region formed on a surface region of the semiconductor substrate outside the trench, the second diffusion region functioning as a drain region;

a gate insulating film formed on a side wall region of the trench inside the trench;

a first conductor formed inside the gate insulating film; and a second conductor formed inside the first conductor through an interlayer dielectric and electrically connecting to the first diffusion region, wherein a trench-etched region that is etched by trench-etching is in a mesh shape, and a non-trench-etched region that is left un-etched is in an island shape.

8. A trench lateral MOSFET, comprising:

a semiconductor substrate;

a trench provided in the semiconductor substrate;

a first diffusion region formed at a bottom of the trench, the first diffusion region functioning as a drain region;

a second diffusion region formed on a surface region of the semiconductor substrate outside the trench, the second diffusion region functioning as a source region;

a gate insulating film formed on a side wall region of the trench inside the trench;

a first conductor formed inside the gate insulating film; and a second conductor formed inside the first conductor through an interlayer dielectric and electrically connecting to the first diffusion region, wherein a trench-etched region that is etched by trench-etching is in a mesh shape, and a non-trench-etched region that is left un-etched is in an island shape.

9. A trench lateral MOSFET, comprising:

a semiconductor substrate;

a trench provided in the semiconductor substrate;

a first diffusion region formed at a bottom of the trench, the first diffusion region functioning as a source region;

a second diffusion region formed on a surface region of the semiconductor substrate outside the trench, the second diffusion region functioning as a drain region;

a gate insulating film formed on a side wall region of the trench inside the trench;

a first conductor formed inside the gate insulating film; and a second conductor formed inside the first conductor through an interlayer dielectric and electrically connecting to the first diffusion region, wherein a trench-etched region that is etched by trench-etching is in a nearly mesh shape, and a non-trench-etched region that is left un-etched is in a ribbed shape.

10. A trench lateral MOSFET, comprising:

a semiconductor substrate;

a trench provided in the semiconductor substrate;

a first diffusion region formed at a bottom of the trench, the first diffusion region functioning as a drain region;

a second diffusion region formed on a surface region of the semiconductor substrate outside the trench, the second diffusion region functioning as a source region;

a gate insulating film formed on a side wall region of the trench inside the trench;

a first conductor formed inside the gate insulating film; and a second conductor formed inside the first conductor through an interlayer dielectric and electrically connecting to the first diffusion region, wherein a trench-etched region that is etched by trench-etching is in a nearly mesh shape, and a non-trench-etched region that is left un-etched is in a ribbed shape.

11. A trench lateral MOSFET, comprising:

a semiconductor substrate;

a trench provided in the semiconductor substrate;

a first diffusion region formed at a bottom of the trench, the first diffusion region functioning as a source region;

a second diffusion region formed on a surface region of the semiconductor substrate outside the trench, the second diffusion region functioning as a drain region;

a gate insulating film formed on a side wall region of the trench inside the trench;

a first conductor formed inside the gate insulating film; and a second conductor formed inside the first conductor through an interlayer dielectric and electrically connecting to the first diffusion region, wherein a trench-etched region that is etched by trench-etching is in an island shape, and a non-trench-etched region that is left un-etched is in a mesh shape.

12. A trench lateral MOSFET, comprising:

a semiconductor substrate;

a trench provided in the semiconductor substrate;

a first diffusion region formed at a bottom of the trench, the first diffusion region functioning as a drain region;

a second diffusion region formed on a surface region of the substrate outside the trench, the second diffusion region functioning as a source region;

a gate insulating film formed on a side wall region of the trench inside the trench;

a first conductor formed inside the gate insulating film; and a second conductor formed inside the first conductor through an interlayer dielectric and electrically connecting to the first diffusion regions wherein a trench-etched region that is etched by trench-etching is in an island shape, and a non-trench-etched region that is left un-etched is in a mesh shape.

13. A trench lateral MOSFET, comprising:

a semiconductor substrate;

a trench provided in the semiconductor substrate;

a first diffusion region formed at a bottom of the trench, the first diffusion region functioning as a source region;

a second diffusion region formed on a surface region of the semiconductor substrate outside the trench, the second diffusion region functioning as a drain region;

a gate insulating film formed on a side wall region of the trench inside the trench;

a first conductor formed inside the gate insulating film; and a second conductor formed inside the first conductor through an interlayer dielectric and electrically connecting to the first diffusion region, wherein a trench-etched region that is etched by trench-etching is in a ribbed shape, and a non-trench-etched region that is left un-etched is in a nearly mesh shape.

14. A trench lateral MOSFET, comprising:

a semiconductor substrate;

a trench provided in the semiconductor substrate;

a first diffusion region formed at a bottom of the trench, the first diffusion region functioning as a drain region;

a second diffusion region formed on a surface region of the semiconductor substrate outside the trench, the second diffusion region functioning as a source region;

a gate insulating film formed on a side wall region of the trench inside the trench;

a first conductor formed inside the gate insulating film; and a second conductor formed inside the first conductor through interlayer dielectric and electrically connecting to the first diffusion region, wherein a trench-etched region that is etched by trench-etching is in a ribbed shape, and a non-trench-etched region that is left un-etched is in a nearly mesh shape.

15. The trench lateral MOSFET of any one of claims 7 through 14, further comprising thick interlayer dielectric having a thickness thicker than a thickness of the gate insulating film, the thick interlayer dielectric being formed on a side wall region of the trench and inside the trench.

16. The trench lateral MOSFET of any one of claims 7 through 14, wherein the trench in an active region, where current is driven in a MOSFET operation, contains at least the gate insulating film, the first conductor, the interlayer dielectric, and the second conductor; and the trench in a gate region, where the first conductor is lead out to a surface of the substrate, is filled with at least one material from a group consisting of the gate insulating film, the first conductor, the interlayer dielectric, and another interlayer dielectric.

17. The trench lateral MOSFET of claim 16, wherein a width of the trench in the gate region is narrower than a width of the trench in the active region.

18. The trench lateral MOSFET of claim 16, further comprising thick interlayer dielectric having a thickness thicker than a thickness of the gate insulating film, the thick interlayer dielectric being formed on a side wall region of the trench and inside the trench.

19. A trench lateral MOSFET, comprising:

a semiconductor substrate;

a trench provided in the semiconductor substrate;

a first diffusion region formed at a bottom of the trench, the first diffusion region functioning as a source region;

a second diffusion region formed on a surface region of the semiconductor substrate outside the trench, the second diffusion region functioning as a drain region;

a gate insulating film formed on a side wall region of the trench inside the trench;

a first conductor formed inside the gate insulating film; and a second conductor formed inside the first conductor through an interlayer dielectric and electrically connecting to the first diffusion region, wherein the trench in an active region, where current is driven in a MOSFET operation, contains at least the gate insulating film, the first conductor, the interlayer dielectric, and the second conductor, and the trench in a gate region, where the first conductor is lead out to a surface of the semiconductor substrate, is filled with a material comprising the gate insulating film, the first conductor, the interlayer dielectric, or another interlayer dielectric and excluding a second conductor.

20. A trench lateral MOSFET, comprising:

a semiconductor substrate;

a trench provided in the semiconductor substrate;

a first diffusion region formed at a bottom of the trench, the first diffusion region functioning as a drain region;

a second diffusion region formed on a surface region of the semiconductor substrate outside the trench, the second diffusion region functioning as a source region;

a gate insulating film formed on a side wall region of the trench inside the trench;

a first conductor formed inside the gate insulating film; and a second conductor formed inside the first conductor through an interlayer dielectric and electrically connecting to the first diffusion region, wherein the trench in an active region, where current is driven in a MOSFET operation, contains at least the gate insulating film, the first conductor, the interlayer dielectric, and the second conductor, and the trench in a gate region, where the first conductor is lead out to a surface of the semiconductor substrate, is filled with a material comprising the gate insulating film, the first conductor, the interlayer dielectric, or another interlayer dielectric and excluding a second conductor.

* * * * *

UNITED STATES PATENT AND TRADEMARK OFFICE
CERTIFICATE OF CORRECTION

PATENT NO. : 6,639,274 B2
DATED : October 28, 2003
INVENTOR(S) : Naoto Fujishima It is certified that error appears in the above-identified patent and that said Letters Patent is hereby corrected as shown below:

Column 18,
Line 48, change "regions" to -- region, --.

Signed and Sealed this

Sixth Day of July, 2004

JON W. DUDAS
*Acting Director of the United States Patent and Trademark Office*